(12) United States Patent
Oku et al.

(10) Patent No.: US 11,626,283 B2
(45) Date of Patent: Apr. 11, 2023

(54) COMPOUND SEMICONDUCTOR SUBSTRATE, A PELLICLE FILM, AND A METHOD FOR MANUFACTURING A COMPOUND SEMICONDUCTOR SUBSTRATE

(71) Applicant: Air Water Inc., Sapporo (JP)

(72) Inventors: Hidehiko Oku, Azumino (JP); Ichiro Hide, Azumino (JP)

(73) Assignee: AIR WATER INC., Hokkaido (JP)

( * ) Notice: Subject to any disclaimer, the term of this patent is extended or adjusted under 35 U.S.C. 154(b) by 0 days.

(21) Appl. No.: 17/580,299

(22) Filed: Jan. 20, 2022

(65) Prior Publication Data

US 2022/0139708 A1    May 5, 2022

Related U.S. Application Data

(62) Division of application No. 15/999,243, filed as application No. PCT/JP2017/004988 on Feb. 10, 2017, now abandoned.

(30) Foreign Application Priority Data

Feb. 19, 2016 (JP) .............................. JP2016-030235
Jun. 7, 2016 (JP) .............................. JP2016-113656
Jan. 20, 2017 (JP) .............................. JP2017-008115

(51) Int. Cl.
   H01L 21/02    (2006.01)
   C23C 16/32    (2006.01)
   (Continued)

(52) U.S. Cl.
   CPC ...... *H01L 21/02447* (2013.01); *C23C 16/325* (2013.01); *C30B 25/18* (2013.01);
   (Continued)

(58) Field of Classification Search
   CPC ......... H01L 21/02447; H01L 21/02164; H01L 21/02381; H01L 21/02527; H01L 21/0254;
   (Continued)

(56) References Cited

U.S. PATENT DOCUMENTS 4,608,326 A * 8/1986 Neukermans ............. G03F 1/62
                                                    430/5
4,735,877 A * 4/1988 Kato ......................... G03F 1/22
                                                    430/5
(Continued)

FOREIGN PATENT DOCUMENTS

EP      3118683 A1    1/2017
JP      07-118854 A   5/1995
(Continued)

OTHER PUBLICATIONS

International Search Report, dated May 9, 2017, in International Application No. PCT/JP2017/004988.
(Continued)

*Primary Examiner* — Earl N Taylor
(74) *Attorney, Agent, or Firm* — Wood, Phillips, Katz, Clark & Mortimer

(57) ABSTRACT

A method for manufacturing a compound semiconductor substrate that can achieve thinning of SiC film, wherein the method includes forming a SiC film on one principal surface side of a Si substrate and forming a recessed part in which a bottom surface is Si in a central part of another principal surface of the Si substrate.

5 Claims, 40 Drawing Sheets

(51) Int. Cl.

| | |
|---|---|
| *C30B 25/18* | (2006.01) |
| *C30B 29/36* | (2006.01) |
| *C30B 29/40* | (2006.01) |
| *H01L 21/306* | (2006.01) |
| *H01L 29/06* | (2006.01) |
| *H01L 29/16* | (2006.01) |
| *H01L 29/20* | (2006.01) |

(52) U.S. Cl.
CPC ............ *C30B 29/36* (2013.01); *C30B 29/406* (2013.01); *H01L 21/0254* (2013.01); *H01L 21/02164* (2013.01); *H01L 21/02381* (2013.01); *H01L 21/02527* (2013.01); *H01L 21/30604* (2013.01); *H01L 29/0657* (2013.01); *H01L 29/1606* (2013.01); *H01L 29/1608* (2013.01); *H01L 29/2003* (2013.01)

(58) Field of Classification Search
CPC ........... H01L 21/30604; H01L 29/0657; H01L 29/1606; H01L 29/1608; H01L 29/2003; C23C 16/325; C30B 25/18; C30B 29/36; C30B 29/406

See application file for complete search history.

(56) References Cited

U.S. PATENT DOCUMENTS

| | | | | |
|---|---|---|---|---|
| 4,971,851 | A * | 11/1990 | Neukermans | G03F 1/22 428/137 |
| 5,809,103 | A * | 9/1998 | Smith | G03F 1/62 378/35 |
| 6,180,292 | B1 * | 1/2001 | Acosta | G03F 1/64 378/208 |
| 6,317,479 | B1 * | 11/2001 | Chiba | G03F 1/62 430/5 |
| 6,337,161 | B2 * | 1/2002 | Chiba | G03F 1/22 430/5 |
| 6,455,203 | B1 * | 9/2002 | Amemiya | G03F 7/2022 430/394 |
| 6,593,035 | B1 * | 7/2003 | Levinson | G03F 1/62 430/5 |
| 7,951,513 | B2 * | 5/2011 | Kubota | G03F 1/62 430/5 |
| 10,001,701 | B1 * | 6/2018 | Hsu | G03F 1/64 |
| 10,088,745 | B2 * | 10/2018 | Nishimura | G03F 1/64 |
| 2002/0018941 | A1 * | 2/2002 | Matsumoto | G03F 1/64 430/5 |
| 2004/0126671 | A1 * | 7/2004 | Smith | G03F 1/62 428/428 |
| 2016/0147141 | A1 * | 5/2016 | Ono | G03F 7/7015 430/5 |
| 2016/0231647 | A1 * | 8/2016 | Hsu | G03F 1/62 |
| 2016/0313637 | A1 * | 10/2016 | Jansen | G03F 1/62 |
| 2017/0040138 | A1 * | 2/2017 | Kumar | H01J 5/18 |
| 2017/0090278 | A1 * | 3/2017 | Chiu | G03F 1/62 |
| 2017/0184956 | A1 * | 6/2017 | Kohmura | H01L 21/027 |
| 2017/0205705 | A1 * | 7/2017 | Ma | G03F 1/62 |
| 2018/0173092 | A1 * | 6/2018 | Lin | G03F 1/24 |
| 2018/0284598 | A1 * | 10/2018 | Schnieders | G03F 1/24 |
| 2019/0177852 | A1 * | 6/2019 | Oku | C30B 25/18 |
| 2019/0204731 | A1 * | 7/2019 | Oku | C30B 25/02 |
| 2020/0152455 | A1 * | 5/2020 | Oku | H01L 21/02529 |
| 2020/0166831 | A1 * | 5/2020 | Oku | C23C 16/325 |

FOREIGN PATENT DOCUMENTS

| | | |
|---|---|---|
| JP | 9-310170 A | 12/1997 |
| JP | 2000156343 A | 6/2000 |
| JP | 2008-56499 A | 3/2008 |
| JP | 2014-240340 A | 12/2014 |
| JP | 2015-202990 A | 11/2015 |
| KR | 20170126265 A | 11/2017 |
| TW | 201600924 A | 1/2016 |
| WO | 2014/188710 A1 | 11/2014 |
| WO | 2015/182482 A1 | 12/2015 |
| WO | 2017141835 A1 | 8/2017 |
| WO | 2019142556 A1 | 7/2019 |

OTHER PUBLICATIONS

International Preliminary Report on Patentability and Written Opinion, dated Aug. 21, 2018, in International Application No. PCT/JP2017/004988.

Khan Malek C et al.: "Semitransparent Soft X-Ray Multilayer Mirros", Optical Engineering, Soc. of Photo-Optical Instrumentation Engineers, Bellingham, vol. 29, No. 6, Jun. 1, 1990, pp. 597-602.

M. L. Schattenburg et al.: "Maskless Single-Sided Wet Etching Process for the Fabrication of Ultra-Low Distortion Polyimide Membranes", MRS Proceedings, vol. 356, Jan. 1, 1994, pp. 615-620.

Extended European Search Report, dated Feb. 21, 2019, in Application No. EP 17 75 3093.

Office Action, dated Apr. 9, 2020, in Chinese Patent Application No. 201780010209.8.

Office Action and Search Report dated Jul. 14, 2020, in Application No. TW106105348.

Second Office Action, dated Oct. 10, 2020, in Chinese Patent Application No. 201780010209.8.

Rejection Decision, dated Mar. 23, 2021, in Chinese Patent Application No. 201780010209.8.

Office Action dated Sep. 30, 2021, in European Patent Application No. 17 753 093.8.

FST, FST's status on EUV Pellicle & Inspection System Development, EUV Pellicle TWG @ IMEC, NL., http://ieuvi.org/TWG/Mask/2015/14_FST_DownwonPark.pdf, Oct. 4, 2015, 17 pages (Year: 2015).

Gallagher, EUV Mask Pellicle TWG, IMEC, http://ieuvi.org/TWG/Mask/2015/1_Intro_imec_EmilyGallagher.pdf, Oct. 4, 2015, 4 pages (Year: 2015).

\* cited by examiner

COMPOUND SEMICONDUCTOR SUBSTRATE, A PELLICLE FILM, AND A METHOD FOR MANUFACTURING A COMPOUND SEMICONDUCTOR SUBSTRATE

TECHNOLOGICAL FIELD

The present invention relates to a compound semiconductor substrate, a pellicle film, and a method for manufacturing a compound semiconductor substrate. More specifically, the present invention relates to a compound semiconductor substrate, a pellicle film, and a method for manufacturing a compound semiconductor substrate having a SiC (silicon carbide) film.

DESCRIPTION OF THE RELATED ART

SiC is superior to Si (silicon) in thermal resistance and withstand voltage property, and the power loss is small when used as an electronic device. For this reason, SiC is being used for high-performance/power-saving inverter equipment, power modules for domestic appliances, power semiconductor elements for electric vehicles, and the like, as next generation semiconductor materials, for example.

In addition, SiC has a higher Young's modulus, a high yield strength at high temperature, and high chemical stability, when compared to Si. For this reason, it is studied to use SiC as MEMS (Micro Electro Mechanical Systems). Furthermore, since SiC has a high light transmittance, other applications utilizing these properties are being studied.

A compound semiconductor substrate with a SiC film is usually formed by forming a SiC film on a Si substrate and then etching a part or all of the Si substrate. When etching the Si substrate, the Si substrate on which the SiC film is formed is immersed in liquid chemical. Techniques for forming a compound semiconductor substrate having a SiC film are disclosed in, for example, Patent Documents 1 to 3 below.

The following Patent Document 1 discloses a technique for forming a SiC film having a thickness of about 1 micrometer on surfaces of a Si substrate. A substrate opening is formed by removing any one of surfaces of the SiC film with an arbitrary area. The Si substrate is etched through the substrate opening with the SiC film as a mask. When etching the Si substrate, a mixed solution of hydrofluoric acid and nitric acid is used.

Patent Document 2 below discloses a technique for manufacturing an X-ray mask containing a SiC film. In this technique, a SiC film of 2 micrometer thickness is formed on Si wafer, and a protective film and an X-ray absorbing film are formed on the SiC film. An etching resistant material is applied in a ring shape on the lower surface of the Si wafer, and the central part of the Si wafer is removed using an aqueous solution of sodium hydroxide.

Patent Document 3 below discloses a technique in which a 3C—SiC layer is formed on one side of a Si substrate containing a reinforcing member. The Si substrate is dissolved with an etching solution mixed with hydrofluoric acid, nitric acid or the like.

PRIOR ART DOCUMENT

Document(s) Related to Patents

Patent Document 1: Japanese Patent Application Laid-open No. (HEI) 09-310170

Patent Document 2: Japanese Patent Application Laid-Open No. (HEI) 07-118854

Patent Document 3: Japanese Patent Application Laid-Open No. 2015-202990

SUMMARY OF THE INVENTION

Problems to be Resolved by the Invention

As a compound semiconductor substrate with a SiC film, the SiC film is required to thin the film. For example, in the case of MEMS using a SiC film, film thinning of the SiC film is required, from the viewpoint of sensitivity improvement. In the case of a pellicle using a SiC film, film thinning of the SiC film is required, from the viewpoint of further improvement of optical transparency.

However, according to the conventional techniques, it was impossible to form a compound semiconductor substrate provided with a thinned SiC film. When attempting to thin the SiC film (for example, to make it to a thickness of 10 micrometer or less), the mechanical strength becomes lower as compared with the case where the SiC film is thick. For this reason, cracks were generated in the SiC film during etching of the Si substrate, and a phenomenon in which the SiC film is peeled off from the Si substrate occurred.

The present invention is intended to solve the above problems, and the object is to provide a compound semiconductor substrate, a pellicle film, and a method for manufacturing a compound semiconductor substrate capable of film thinning of the SiC film.

Means for Solving the Problem

According to one aspect of the present invention, a compound semiconductor substrate comprises: a Si substrate having a ring-like planar shape, and a SiC film having a thickness of 20 nanometers or more and 10 micrometers or less, formed on one principal surface side of the Si substrate, wherein the SiC film is not formed on another principal surface side of the Si substrate.

Preferably, according to the compound semiconductor substrate, width of the Si substrate decreases with distance from the SiC film, when viewed in a cross section cut along a plane perpendicular to a surface of the SiC film.

Preferably, the compound semiconductor substrate further comprises a film different from SiC, formed on one principal surface of the SiC film.

Preferably, according to the compound semiconductor substrate, the film different from SiC is made of graphene, graphite, or GaN (gallium nitride).

Preferably, according to the compound semiconductor substrate, the SiC film is formed on the one principal surface of the Si substrate.

Preferably, the compound semiconductor substrate further comprises a Si oxide film formed on the one principal surface of the Si substrate, wherein the SiC film is formed on the one principal surface side of the Si oxide film.

According to another aspect of the present invention, a pellicle film uses the compound semiconductor substrate described above.

According to still another aspect of the present invention, a method for manufacturing a compound semiconductor substrate comprises a step of forming a SiC film on one principal surface side of a Si substrate, and a step of exposing at least a part of a principal surface of the SiC film on the Si substrate side by wet etching, wherein in the step of exposing at least a part of a principal surface of the SiC film on the Si substrate side, at least the Si substrate and the SiC film are relatively moved with respect to the liquid chemical used for the wet etching.

Preferably, according to the method for manufacturing a compound semiconductor substrate, in the step of exposing at least a part of a principal surface of the SiC film on the Si substrate side, at least the Si substrate and the SiC film are moved in a direction in a plane parallel to the one principal surface of the SiC film.

Preferably, according to the method for manufacturing a compound semiconductor substrate, in the step of exposing at least a part of a principal surface of the SiC film on the Si substrate side, at least the Si substrate and the SiC film being rotated, a liquid chemical used for the wet etching is injected into the another principal surface of the Si substrate.

Preferably, the method for manufacturing a compound semiconductor substrate comprises a step of forming a recessed part in which a bottom surface is Si in a central part of the another principal surface of the Si substrate, wherein in the step of exposing at least a part of a principal surface of the SiC film on the Si substrate side, the SiC film is exposed on the bottom surface of the recessed part.

Preferably, according to the method for manufacturing a compound semiconductor substrate, the step of forming the SiC film is performed after the step of forming the recessed part in the central part of the another principal surface of the Si substrate.

Preferably, according to the method for manufacturing a compound semiconductor substrate, the step of forming the recessed part in the central part of the another principal surface of the Si substrate is performed after the step of forming the SiC film.

Preferably, according to the method for manufacturing a compound semiconductor substrate, the central part of the another principal surface of the Si substrate is removed by wet etching, using a mask layer made of an oxide film or a nitride film formed on the another principal surface of the Si substrate as a mask, in the step of forming the recessed part in the central part of the another principal surface of the Si substrate.

Preferably, according to the method for manufacturing a compound semiconductor substrate, the SiC film is formed on the one principal surface side and a side surface of the Si substrate and on a peripheral part of the another principal surface of the Si substrate, in the step of forming the SiC film, and the another principal surface of the Si substrate is removed, using the SiC film formed on the peripheral part of the another principal surface of the Si substrate as a mask, in the step of exposing at least a part of the principal surface of the SiC film on the Si substrate side.

Preferably, according to the method for manufacturing a compound semiconductor substrate, a mixed acid containing hydrofluoric acid and nitric acid is used as the liquid chemical used for the wet etching, in the step of exposing at least a part of a principal surface of the SiC film on the Si substrate side.

Preferably, the method for manufacturing a compound semiconductor substrate further comprises a step of forming a GaN film on a principal surface of the SiC film opposite to the Si substrate side, after the step of exposing at least a part of a principal surface of the SiC film on the Si substrate side.

Preferably, the method for manufacturing a compound semiconductor substrate further comprises a step of change a part of the SiC film to a graphene film or a graphite film.

Preferably, the method for manufacturing a compound semiconductor substrate further comprises a step of forming a graphene film or a graphite film laminated on a principal surface of the SiC film opposite to the Si substrate side.

Preferably, according to the method for manufacturing a compound semiconductor substrate, the SiC film is formed on the one principal surface of the Si substrate in the step of forming the SiC film.

Preferably, the method for manufacturing a compound semiconductor substrate further comprises a step of forming a Si oxide film on the one principal surface of the Si substrate, wherein the SiC film is formed on one principal surface side of the Si oxide film, in the step of forming the SiC film.

Effect of the Invention

According to the present invention, it is possible to provide a compound semiconductor substrate, a pellicle film, and a method for manufacturing a compound semiconductor substrate capable of film thinning of the SiC film.

DETAILED DESCRIPTION OF EMBODIMENTS

Hereinafter, embodiments of the present invention will be described with reference to the drawings.

First Embodiment

Figure 1:
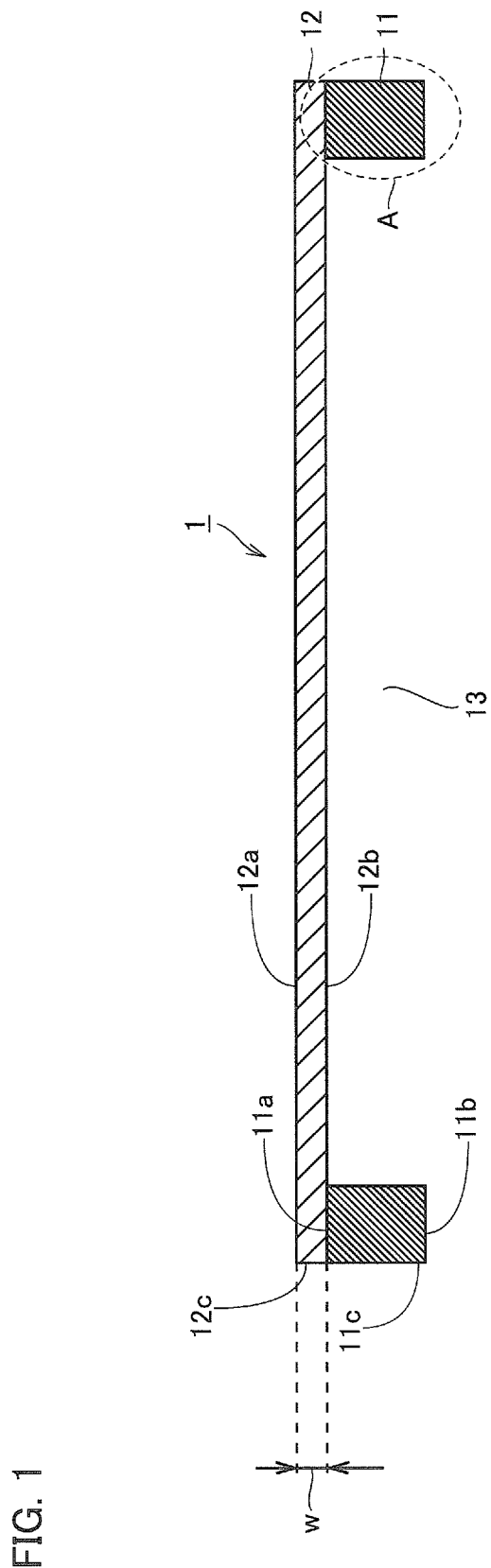
FIG. 1 is a cross-sectional view showing a configuration of a compound semiconductor substrate 1 in a first embodiment of the present invention.

FIG. 1 is a cross-sectional view showing a configuration of a compound semiconductor substrate 1 in a first embodiment of the present invention. Note that FIG. 1 is a cross-sectional view obtained by cutting with a plane perpendicular to the surface 12a of the SiC film 12.

Referring to FIG. 1, the compound semiconductor substrate 1 in this embodiment includes a Si substrate 11 and a SiC film 12.

The Si substrate 11 has a ring-like planar shape. The Si substrate 11 includes an obverse side 11a, a reverse side 11b, and a side surface 11c. The (111) plane is exposed on the obverse side 11a of the Si substrate 11. The (100) plane and the (110) plane may be exposed on the obverse side 11a of the Si substrate 11.

The SiC film 12 is formed on the obverse side 11a (an example of one of the principal surfaces of the Si substrate) of the Si substrate 11. The SiC film 12 includes an obverse side 12a, a reverse side 12b, and a side surface 12c. The reverse side 12b of the SiC film 12 is exposed to the recessed part 13 inside the ring-like Si substrate 11. The SiC film 12 is not formed on the reverse side 11b (an example of the other of the principal surfaces of the Si substrate) of the Si substrate 11. The reverse side 11b of the Si substrate 11 is exposed.

The SiC film 12 has a thickness w of not less than 20 nanometers and not more than 10 micrometers. The thickness w is preferably 1 micrometer or less, more preferably 500 nanometers or less. The SiC film 12 is made of single-crystal 3C—SiC, poly-crystal 3C—SiC, amorphous SiC or the like. In particular, when SiC film 12 is epitaxially grown on the surface of Si substrate 11, generally SiC film 12 is made of 3C—SiC.

Figure 2:
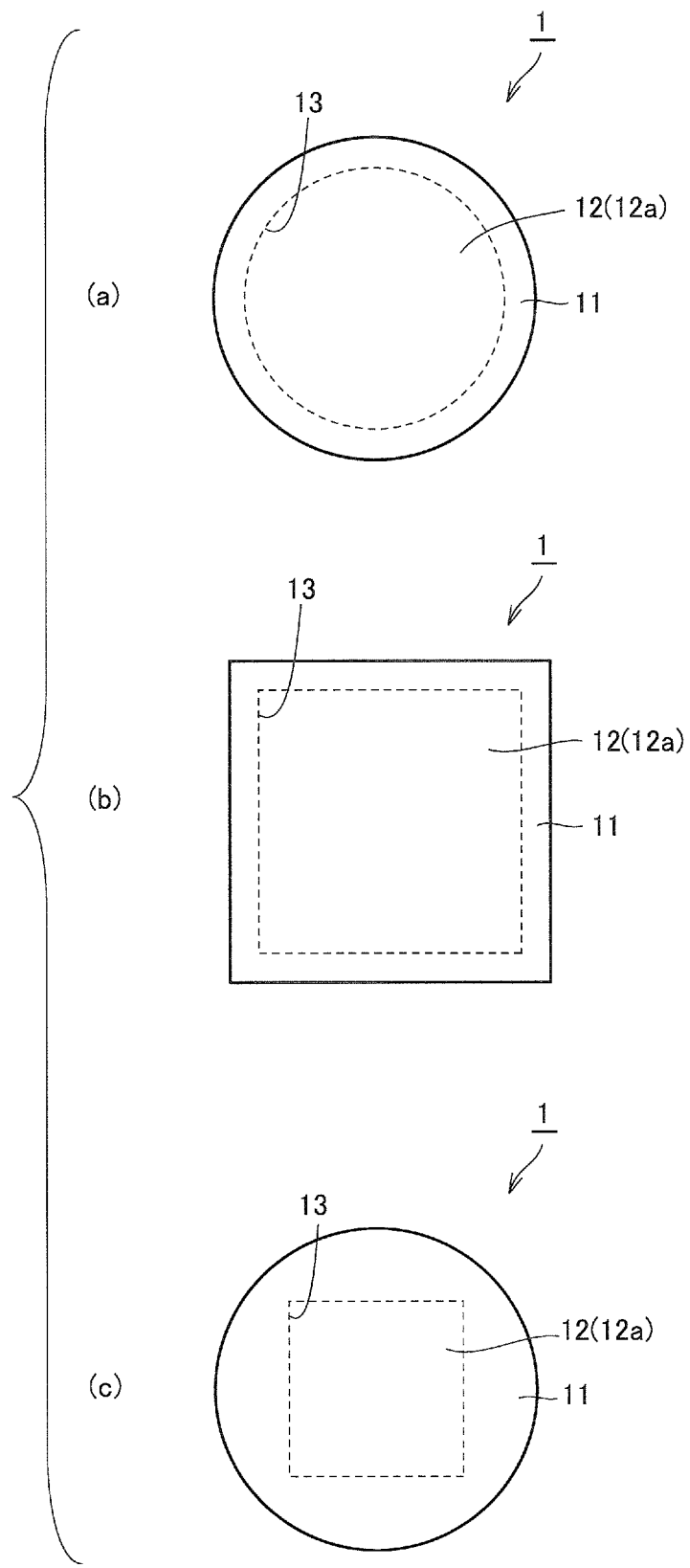
FIG. 2 is a plan view showing a configuration of a compound semiconductor substrate 1 when viewed from a direction perpendicular to the surface 12a of the SiC film 12 in the first embodiment of the present invention.

FIG. 2 is a plan view showing a configuration of compound semiconductor substrate 1 shown from a direction perpendicular to the obverse side 12a of the SiC film 12 in the first embodiment of the present invention. In FIG. 2, for the purpose of showing the shape of the Si substrate 11, the Si substrate 11 is indicated by a dotted line. However, in reality, Si substrate 11 is not directly visible.

Referring to FIG. 2, each of Si substrate 11, SiC film 12, and recessed part 13 has an arbitrary planar shape. SiC film 12 is supported at its outer peripheral end by a ring-like Si substrate 11. As a result, the mechanical strength of the SiC film 12 is reinforced by the Si substrate 11. Each of the Si substrate 11, the SiC film 12, and the recessed part 13 may have a planar shape of a circle as shown in FIG. 2 (a), for example. As shown in FIG. 2 (b), each of Si substrate 11, SiC film 12, and recessed part 13 may have a rectangular planar shape. In FIG. 2 (b), Si substrate 11 has a square ring-like planar shape. Furthermore, as shown in FIG. 2 (c), each of the Si substrate 11 and the SiC film 12 may have a planar shape of a circle, and the recessed part 13 may have a rectangular planar shape. The size of the recessed part 13 is arbitrary and may be determined according to the mechanical strength and the like required for the compound semiconductor substrate 1.

Next, a method for manufacturing of compound semiconductor substrate 1 in this embodiment will be described with reference to FIGS. 3 to 9.

Figure 3:
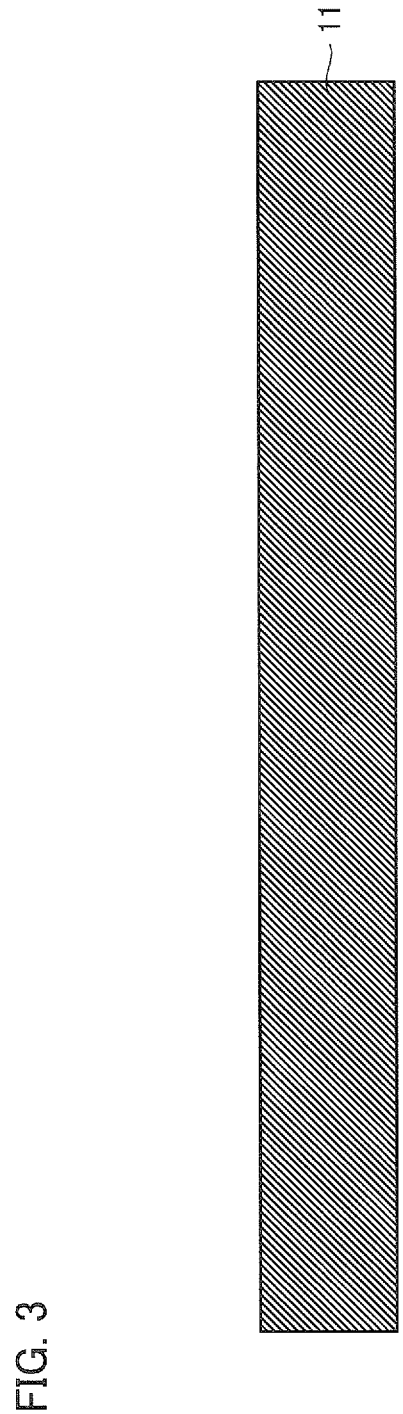
FIG. 3 is a cross-sectional view showing a first step of method for manufacturing of compound semiconductor substrate 1 in the first embodiment of the present invention.

Referring to FIG. 3, for example, a disc-shaped Si substrate 11 (with no recessed part 13 formed) is prepared.

Figure 4:
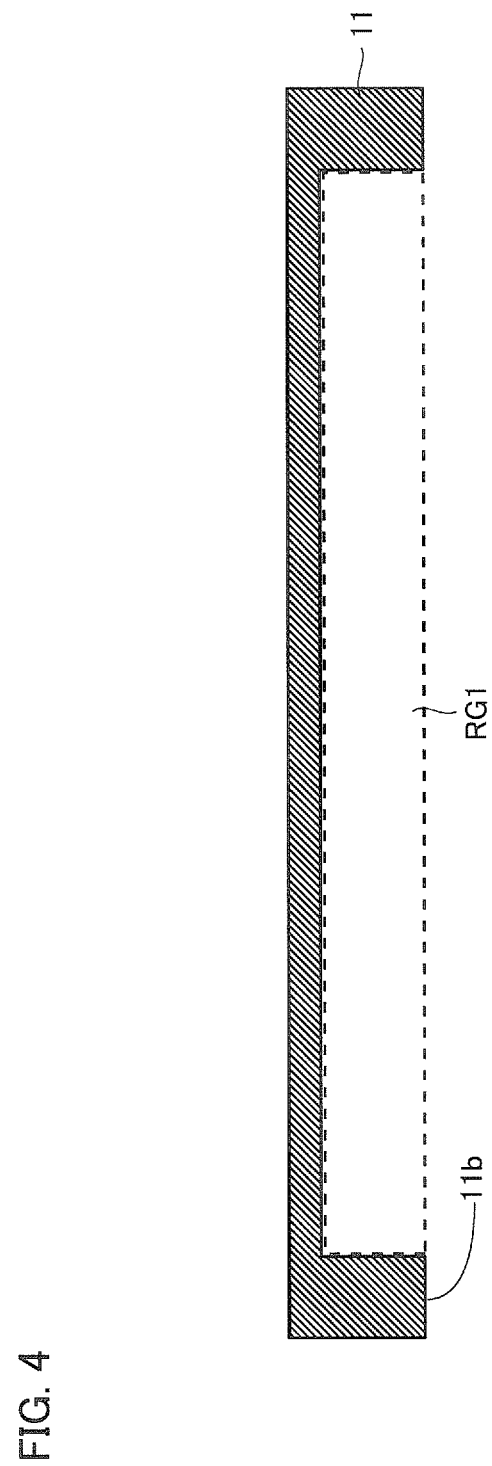
FIG. 4 is a cross-sectional view showing a second step of method for manufacturing of compound semiconductor substrate 1 in the first embodiment of the present invention.

Next, referring to FIG. 4, Si of the central part RG1 of the reverse side 11b of the Si substrate 11 is removed. The removal of Si in the central part RG1 may be performed by mechanically grinding the Si of the central part RG1 of the Si substrate 11. Further, in removing the Si of the central part RG1, a photoresist may be formed in a region other than the central part RG1 in the reverse side 11b of the Si substrate 11. The Si of the central part RG1 may be etched using the formed photoresist as a mask.

In addition, when increasing the resistance of a mask to liquid chemical used for wet etching of Si, removal of Si in central part RG1 may be carried out by the following method.

Figure 5:
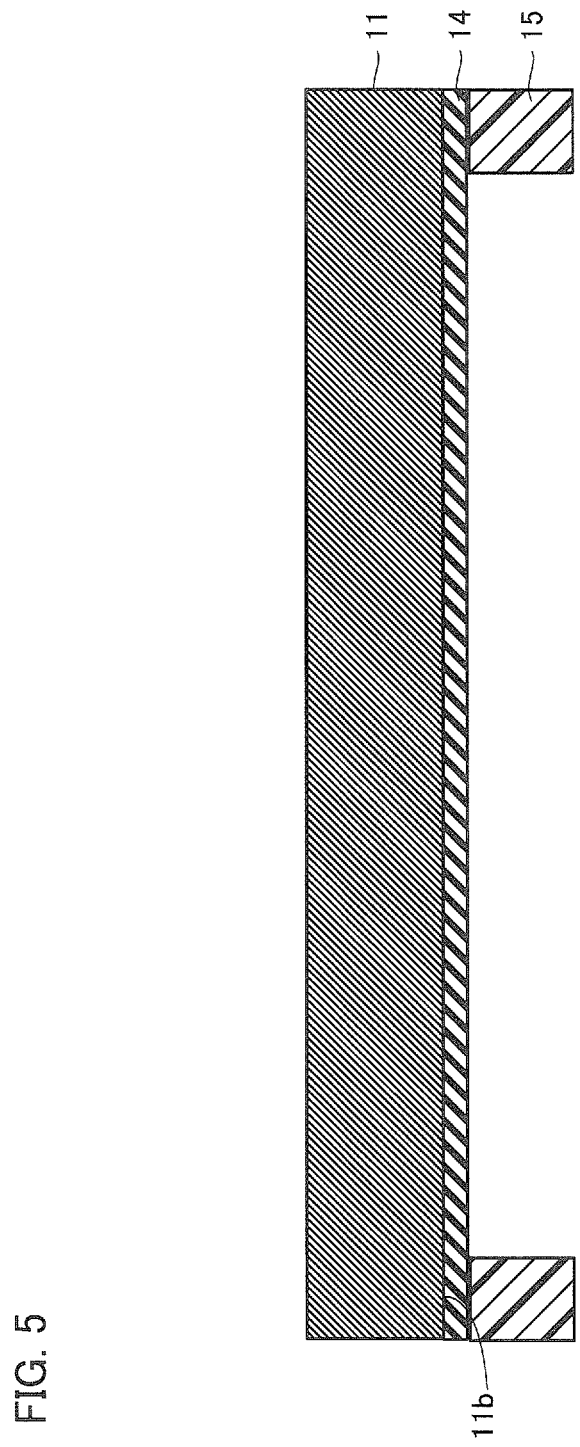
FIG. 5 is a cross-sectional view showing a first step of modification of the step shown in FIG. 4.

Referring to FIG. 5, a mask layer 14 made of a silicon oxide film or a silicon nitride film is formed on the entire surface of the reverse side 11b of the Si substrate 11. Subsequently, a patterned photoresist 15 is formed on the mask layer 14 in a required shape.

Figure 6:
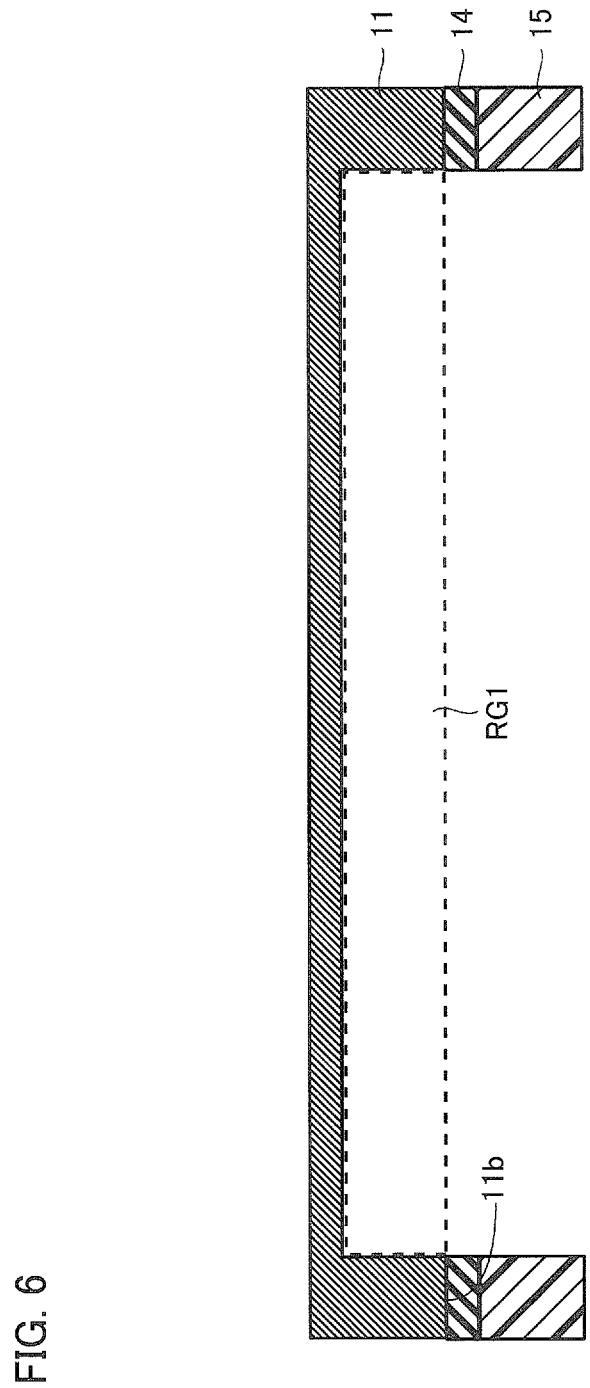
FIG. 6 is a cross-sectional view showing a second step of modification of the step shown in FIG. 4.

Next, referring to FIG. 6, using the photoresist 15 as a mask, the mask layer 14 is patterned by wet etching. As a result, only the peripheral part of the mask layer 14 is left. When the mask layer 14 is made of a silicon oxide film, as a liquid chemical for wet etching of the mask layer 14, a hydrofluoric acid solution or the like is used. When the mask layer 14 is made of a silicon nitride film, a phosphorus acid solution or the like is used as a liquid chemical for wet etching of the mask layer 14. Subsequently, using patterned mask layer 14 as a mask, Si of central part RG1 is removed by wet etching using liquid chemical such as mixed acid. Thereafter, the photoresist 15 and the mask layer 14 are removed. It should be noted that the photoresist 15 may be removed before wet etching of Si.

In the step shown in FIG. 3, a step of forming the mask layer 14 shown in FIG. 5 may be omitted by preparing a substrate in which the mask layer 14 is formed in advance on the reverse side 11b of the Si substrate 11. As the mask layer 14, a silicon oxide film, and an oxide film or a nitride film other than a silicon oxide film may be used.

Figure 7:
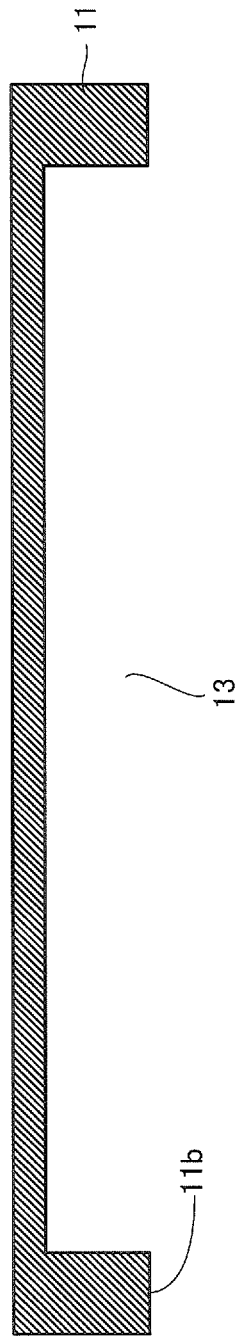
FIG. 7 is a cross-sectional view showing a third step of method for manufacturing of compound semiconductor substrate 1 in the first embodiment of the present invention.

With reference to FIG. 7, as a result of removing the Si of the central part RG1, a recessed part 13 is formed on the reverse side 11b of the Si substrate 11. In FIG. 7, the recessed part 13 has a depth not penetrating the Si substrate 11, and the bottom surface of the recessed part 13 is made of Si. Due to the presence of the recessed part 13, the thickness of the central part of the Si substrate 11 (length in the vertical direction in FIG. 7) is thinner than the thickness of the peripheral part of the Si substrate 11.

Figure 8:
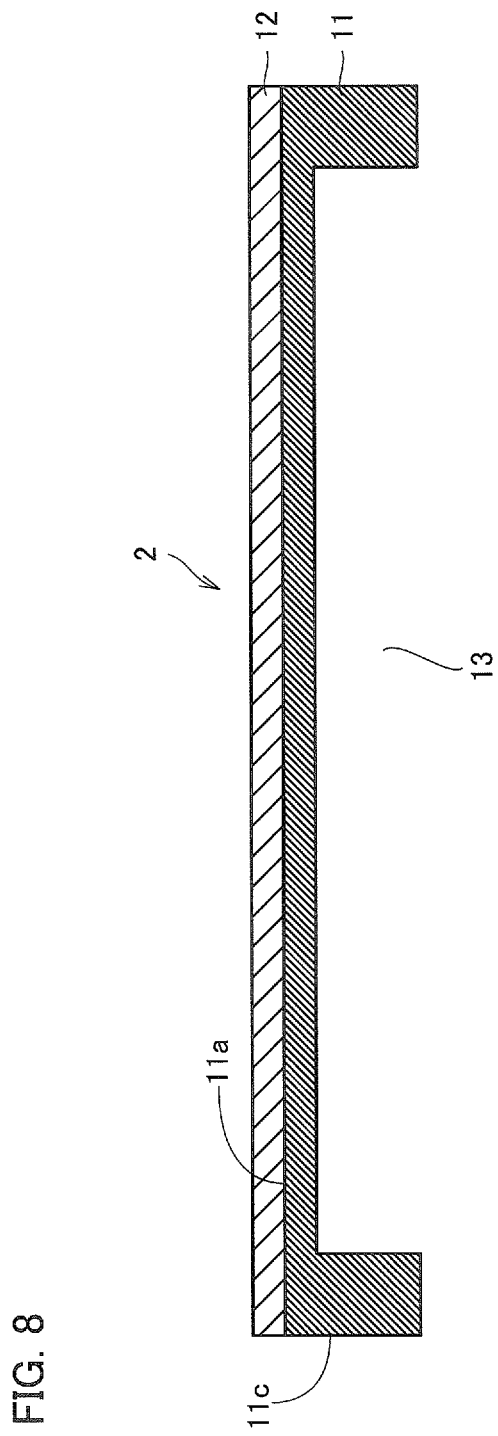
FIG. 8 is a cross-sectional view showing a fourth step of method for manufacturing of compound semiconductor substrate 1 in the first embodiment of the present invention.

Referring to FIG. 8, after forming the recessed part 13, a SiC film 12 is formed on the obverse side 11a of the Si substrate 11. For example, SiC film 12 is formed on the foundation layer made of SiC obtained by carbonizing obverse side 11a of Si substrate 11, by using an MBE (Molecular Beam Epitaxy) method, a CVD (Chemical Vapor Deposition) method, or the like. Further, the SiC film 12 may be formed only by carbonizing the obverse side 11a of the Si substrate 11. Further, the SiC film 12 may be formed on the obverse side 11a of the Si substrate 11 by using the MBE method, the CVD method, or the like. In the formation of the SiC film 12, SiC film 12 may also be formed on the side surface 11c of the Si substrate 11.

Figure 9:
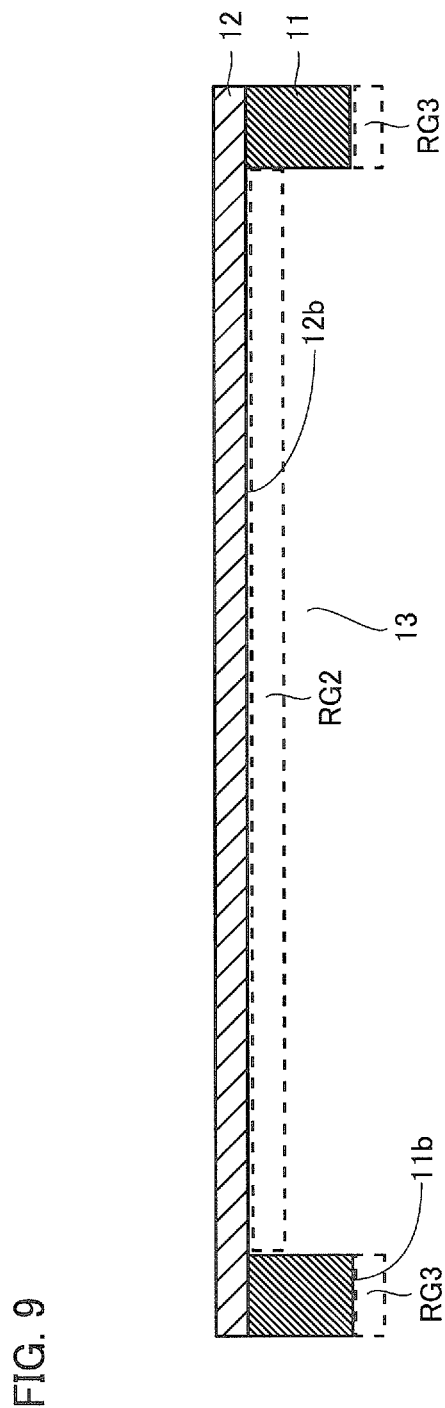
FIG. 9 is a cross-sectional view showing a fifth step of method for manufacturing of compound semiconductor substrate 1 in the first embodiment of the present invention.

Subsequently, with reference to FIG. 9, the bottom surface RG2 of the recessed part 13 of the Si substrate 11 is removed by wet etching. The bottom surface RG2 constitutes a part of the reverse side 11b of the Si substrate. As a result of removing the Si of the bottom surface RG2, the reverse side 12b of the SiC film 12 is exposed on the bottom surface of the recessed part 13. In this wet etching, Si of the peripheral part RG3 of the reverse side 11b of the Si substrate 11 together with Si of the bottom surface RG2 is also removed. By adopting wet etching, it is possible to prevent damage to the SiC film 12 when removing the Si substrate. By the above steps, the compound semiconductor substrate 1 shown in FIG. 1 is completed.

The wet etching of Si on the bottom surface RG2 is performed by relatively moving Si substrate 11 and SiC film 12 with respect to liquid chemical used for wet etching. Movement of Si substrate 11 and SiC film 12 includes, for example: rotating Si substrate 11 and SiC film 12 without changing the positions of Si substrate 11 and SiC film 12, changing the positions of the Si substrate 11 and the SiC film 12 (in other words, moving the Si substrate 11 and the SiC film 12), and rotating Si substrate 11 and SiC film 12 while changing the positions of Si substrate 11 and SiC film 12. As the liquid chemical used for wet etching of Si, for example, mixed acid including hydrofluoric acid and nitric acid, aqueous potassium hydroxide (KOH) solution, or the like is used.

When an alkaline solution such as an aqueous potassium hydroxide solution is used as liquid chemical for wet etching of Si, SiC film 12 may also be etched through pinholes present in low density in SiC film 12. To prevent the SiC film 12 from being etched, in order to improve the quality of the SiC film 12, it is preferable to use the aforementioned mixed acid as liquid chemical for wet etching of Si.

The direction of moving Si substrate 11 and SiC film 12 during wet etching of Si is arbitrary. However, in order to avoid the situation where the SiC film 12 is damaged by the pressure received from the liquid chemical while moving the Si substrate 11 and the SiC film 12, it is preferable to move Si substrate 11 and SiC film 12 in a direction in a plane parallel to the obverse side 12a of SiC film 12 (plane PL in FIGS. 10 to 12) as in the following first to third methods.

Figure 10:
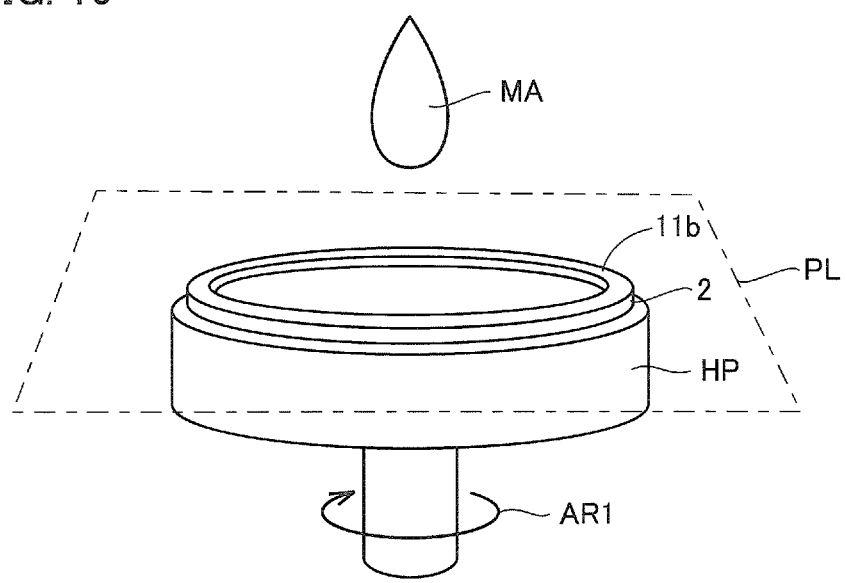
FIG. 10 is a view schematically showing a first method of wet etching of Si in the first embodiment of the present invention.
Figure 11:
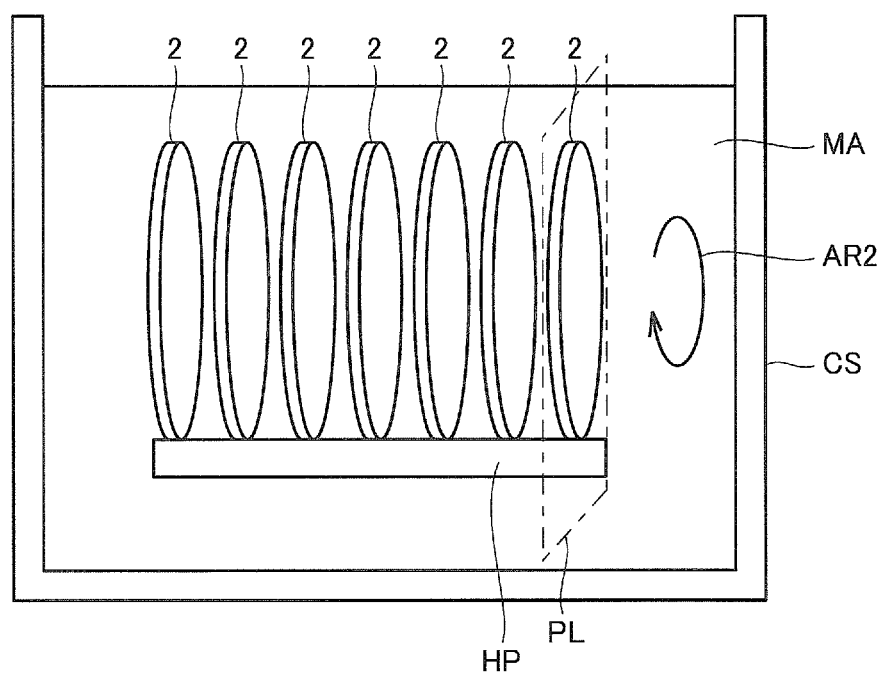
FIG. 11 is a view schematically showing a second method of wet etching of Si in the first embodiment of the present invention.
Figure 12:
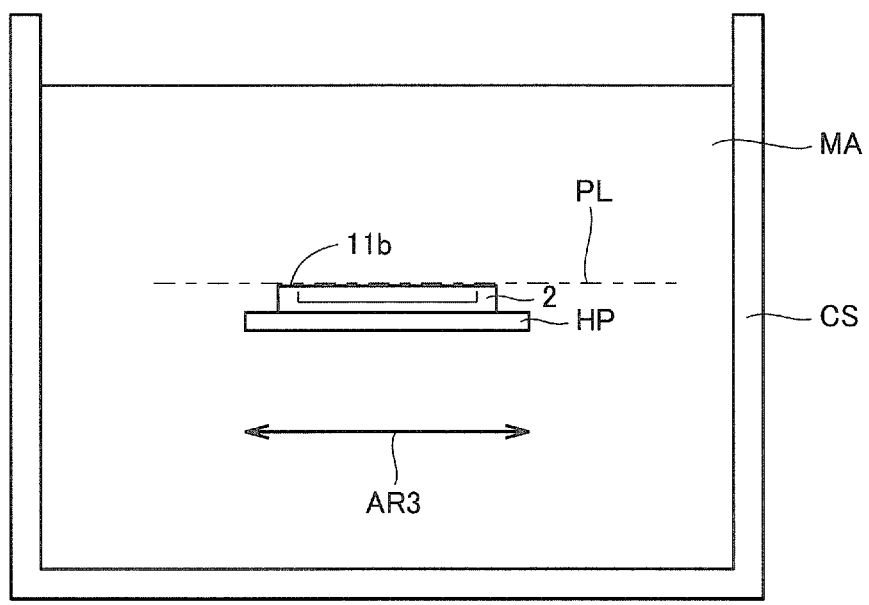
FIG. 12 is a view schematically showing a third method of wet etching of Si in the first embodiment of the present invention.

FIGS. 10 to 12 are diagrams schematically showing the first to third methods of wet etching of Si in the first embodiment of the present invention. In the explanation of FIGS. 10 to 12, the structure immediately before wet etching of Si is indicated as intermediary body 2. In the present embodiment, the structure immediately after the step of FIG. 8 corresponds to intermediary body 2. In the second embodiment to be described later, the structure immediately after the step of FIG. 17 corresponds to the intermediary body 2.

Referring to FIG. 10, the first method is a method of removing Si by spin etching. In the first method, the intermediary body 2 is fixed to the holding platform HP, so that the reverse side 11b of the Si substrate 11 faces upward. Then, as indicated by the arrow AR 1, the holding platform HP is rotated about the rotation axis extending in a direction orthogonal to the reverse side 11b. In this way, with the intermediary body 2 rotated without changing the position of the intermediary body 2, liquid chemical MA (etchant) used for wet etching is injected into the reverse side 11b of the Si substrate 11. The rotational number of the holding platform HP is set to about 500 to 1500 rpm, for example.

Referring to FIG. 11, in the second method, a plurality of intermediary bodies 2 in an upright condition are fixed to the holding platform HP. Then, the plurality of intermediary bodies 2 are immersed in liquid chemical MA filled in the reaction vessel CS. In the plane PL parallel to the obverse side 12a of the SiC film 12, the intermediary body 2 and the holding platform HP are rotated, while changing the position of the intermediary bodies 2 as indicated by the arrow AR2.

Referring to FIG. 12, in the third method, the intermediary body 2 is fixed to the holding platform HP so that the reverse side 11b of the Si substrate 11 faces upward. Then, intermediary body 2 is immersed in liquid chemical MA filled in reaction vessel CS. In the plane PL parallel to the obverse side 12a of the SiC film 12, the intermediary body 2 and the holding platform HP are reciprocated on a straight line as indicated by an arrow AR3.

Figure 13:
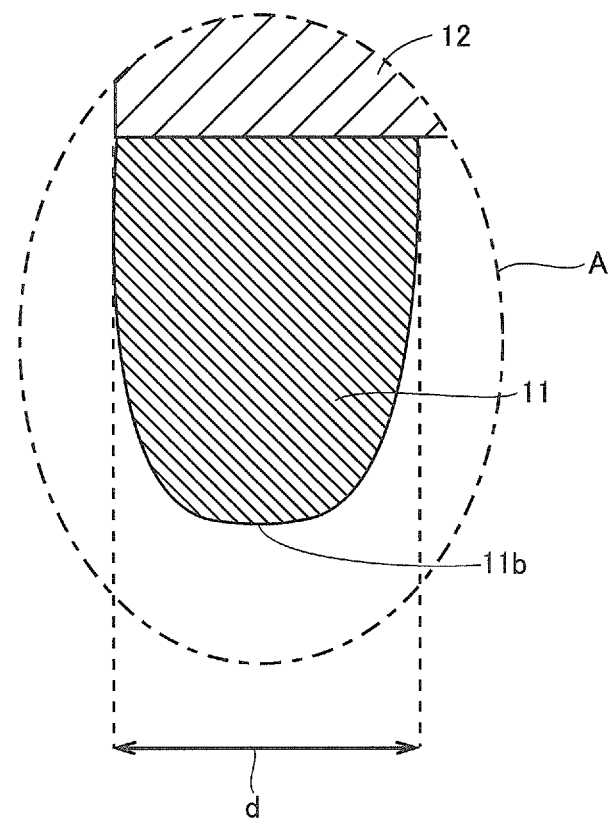
FIG. 13 is an enlarged view of part A of the compound semiconductor substrate 1 shown in FIG. 1.

FIG. 13 is an enlarged view of part A of the compound semiconductor substrate 1 shown in FIG. 1. In FIG. 13, the amount of change in the width of the Si substrate 11 is emphasized more than the actual one.

Referring to FIG. 13, the mixed acid including hydrofluoric acid and nitric acid has an action of isotropically etching Si. For this reason, when wet etching of Si is performed using mixed acid including hydrofluoric acid and nitric acid as liquid chemical, the width d (the length in the lateral direction in FIG. 13) of the Si substrate 11 decreases as it goes away from the SiC film 12 (from the SiC film 12 toward the reverse side 11b of the Si substrate 11) as a trace thereof.

Figure 14:
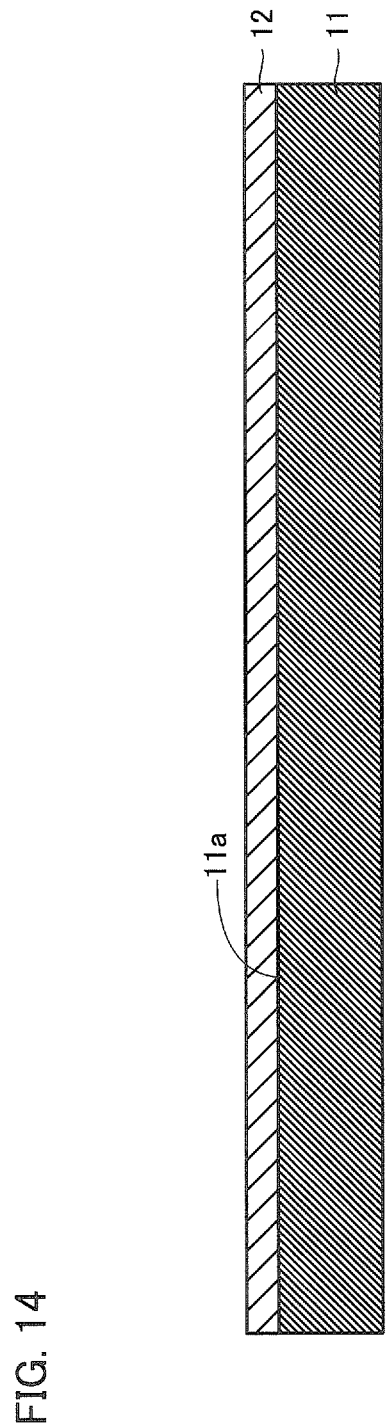
FIG. 14 is a cross-sectional view showing a first step of modification of method for manufacturing of compound semiconductor substrate 1 in the first embodiment of the present invention.
Figure 15:
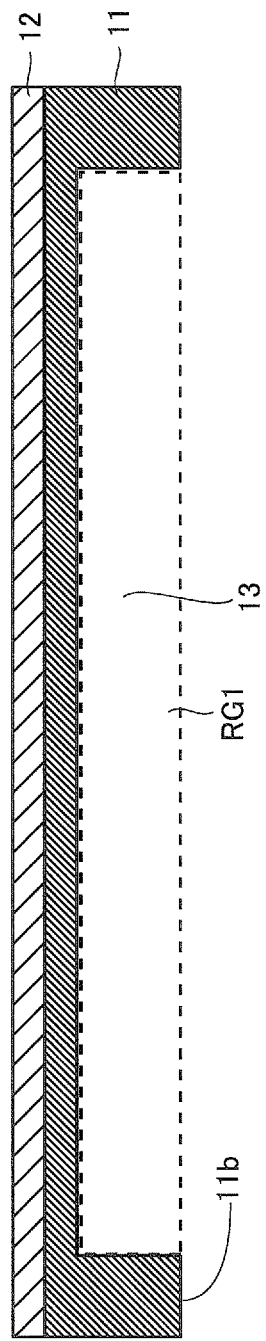
FIG. 15 is a cross-sectional view showing a second step of modification of method for manufacturing of compound semiconductor substrate 1 in the first embodiment of the present invention.

As a modification of method for manufacturing of this embodiment, as shown in FIG. 14, after forming the SiC film 12 on the obverse side 11a of the Si substrate 11, as shown in FIG. 15, Si of the central part RG1 of the reverse side 11b of the Si substrate 11 may be removed to form the recessed part 13. Thereafter, the bottom portion RG2 of the recessed part 13 may be removed by wet etching.

According to the present embodiment, during the wet etching of the Si substrate 11, the Si substrate 11 and the SiC film 12 are relatively moved with respect to the liquid chemical of wet etching. This makes it possible to prevent cracks from the SiC film 12 during wet etching of the Si substrate 11 and to prevent peeling of the SiC film 12 from the Si substrate 11. Film thinning of SiC film 12 in compound semiconductor substrate 1 can be achieved.

The inventors of the present application have found the followings. The cause of the cracks entering the SiC film 12 during the wet etching of the Si substrate 11 (while immersing the Si substrate 11 in the liquid chemical) and peeling of the SiC film 12 from the Si substrate 11 are as follows. Liquid chemical after the reaction stays locally on the reaction surface of Si substrate 11 (the surface of the part reacting with liquid chemical in reverse side 11b of Si substrate 11). As a result, the etching rate of Si becomes nonuniform, causing roughness on the reaction surface of the Si substrate 11. In addition, the inventors of the present application have found the followings. When a mixed acid is used as the liquid chemical of wet etching, large bubbles generated by the reaction between liquid chemical and Si locally stay on the reaction surface of Si substrate 11. The bubbles locally hinder the reaction with the liquid chemical on the reaction surface of the Si substrate 11, causing roughness on the reaction surface of the Si substrate 11.

When the SiC film 12 is relatively thick (for example, when the thickness is larger than 10 micrometer), since the mechanical strength of the SiC film 12 itself is high, roughness of the reaction surface of the Si substrate 11 does not adversely affect the SiC film 12 so much. However, when the SiC film 12 is relatively thin (for example, when the thickness is 10 micrometers or less, specifically, in the case of a thin film (thickness of about several micrometer) or an extremely thin film (thickness of 100 nanometer order or less)), the roughness of the reaction surface of Si substrate 11 exerts an adverse effect on SiC film 12. That is, uneven stress is applied to the SiC film 12 due to the roughness of the reaction surface of the Si substrate 11. This causes situation in which the SiC film 12 is cracked or the SiC film 12 peels off from the Si substrate 11 during Si etching.

Therefore, in the present embodiment, during the wet etching of the Si substrate 11, the Si substrate 11 and the SiC film 12 are relatively moved with respect to the liquid chemical of wet etching. In this way, it is possible to prevent residual liquid chemicals and bubbles after the reaction locally on the reaction surface of the Si substrate 11. Roughening of the reaction surface of the Si substrate 11 can be suppressed. As a result, it is possible to prevent nonuniform stress from being applied to the SiC film 12, and film thinning of the SiC film 12 can be achieved.

In particular, when a method of removing Si by spin etching (the first method shown in FIG. 10) is adopted as a method of wet etching of Si, the SiC film 12 is exposed to liquid chemical during wet etching only while the reverse side 12b of the SiC film 12 is exposed at the bottom of the recessed part 13. Also, during wet etching, the obverse side 12a of the SiC film 12 is not exposed to liquid chemical. Therefore, damage of SiC film 12 by liquid chemical can be minimized.

Moreover, by using mixed acid as the liquid chemical of wet etching of Si, damage of SiC film 12 by liquid chemical can be suppressed. As a result, the yield of the SiC film 12 can be improved, and the SiC film can be formed in a large area.

Second Embodiment

Figure 16:
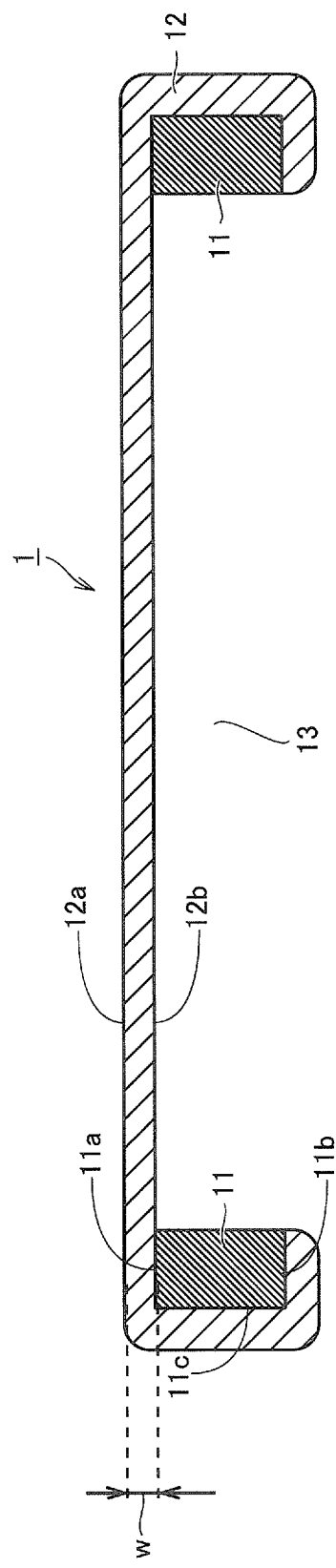
FIG. 16 is a cross-sectional view showing a configuration of a compound semiconductor substrate 1 according to a second embodiment of the present invention.

FIG. 16 is a cross-sectional view showing the configuration of the compound semiconductor substrate 1 in the second embodiment of the present invention. FIG. 16 is a cross-sectional view obtained by cutting with a plane perpendicular to the obverse side 12a of the SiC film 12.

Referring to FIG. 16, in the compound semiconductor substrate 1 of the present embodiment, the SiC film 12 is formed on the obverse side 11a, the side surface 11c, and the peripheral parts of the reverse side 11b of the Si substrate 11. The obverse side 11a, side surface 11c, and peripheral parts of reverse side 11b of Si substrate 11 are completely covered with continuous SiC film 12. At the bottom of the recessed part 13, the reverse side 12b of the SiC film 12 is exposed. The thickness of the SiC film 12 decreases at the edge of the peripheral part of the reverse side 11b. The portion of the SiC film 12 formed on the obverse side 11a of the Si substrate has a thickness w of not less than 20 nanometers and not more than 10 micrometers. The thickness w is preferably 1 micrometer or less, more preferably 500 nanometers or less.

Next, method for manufacturing of compound semiconductor substrate 1 in this embodiment will be described with reference to FIGS. 17 and 18.

Figure 17:
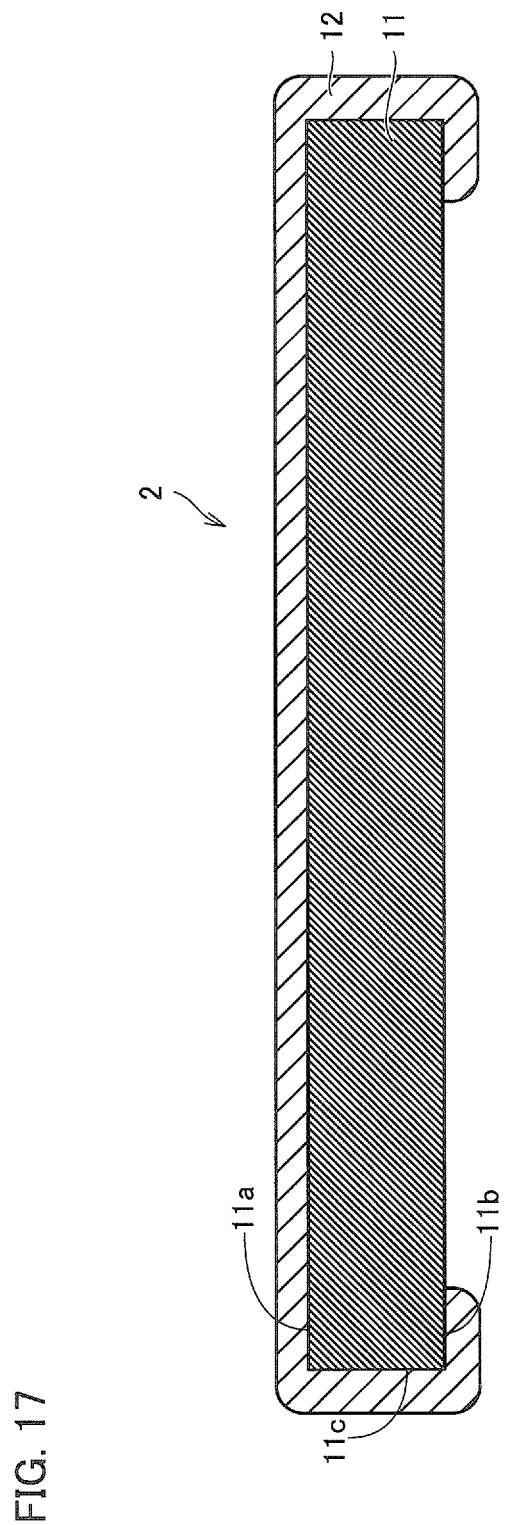
FIG. 17 is a cross-sectional view showing a first step of method for manufacturing of compound semiconductor substrate 1 in the second embodiment of the present invention.
Figure 18:
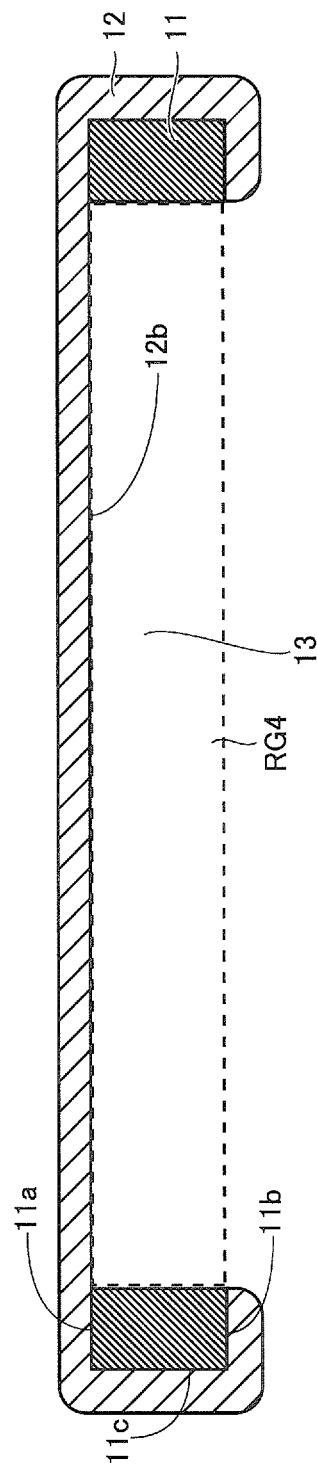
FIG. 18 is a cross-sectional view showing a second step of method for manufacturing of compound semiconductor substrate 1 in the second embodiment of the present invention.

Referring to FIG. 17, for Si substrate 11 shown in FIG. 3, SiC film 12 is formed by the CVD method. When forming the SiC film 12, so that a part of the source gas supplied to the obverse side 11a of the Si substrate 11 also goes around the side surface 11c and the reverse side 11b of the Si substrate 11, the Si substrate 11 is held. As a result, the chemical reaction of the source gas also occurs in the obverse side 11a, the side surface 11c, and the peripheral parts of the reverse side 11b of the Si substrate 11. Continuous SiC films 12 are formed on the obverse side 11a, the side surface 11c, and the peripheral parts of the reverse side 11b of the Si substrate 11. As a result, the intermediary body 2 in this embodiment is obtained.

Subsequently, with reference to FIG. 18, using the SiC film 12 formed in the peripheral part of the reverse side 11b of the Si substrate 11 as a mask, the exposed central part RG4 of the reverse side 11b of the Si substrate 11 is removed by wet etching. As a result of removing the Si of the central part RG4, a recessed part 13 is formed on the reverse side 11b of the Si substrate. On the bottom surface of the recessed part 13, the reverse side 12b of the SiC film 12 is exposed. In this wet etching, Si in the peripheral part covered with the SiC film 12 in the reverse side 11b of the Si substrate 11 is not removed. By the above steps, the compound semiconductor substrate 1 shown in FIG. 16 is completed.

In the step shown in FIG. 17 (the step of forming SiC film 12 by CVD method), the Si substrate 11 is preferably held in the CVD apparatus, by the following method.

Figure 19:
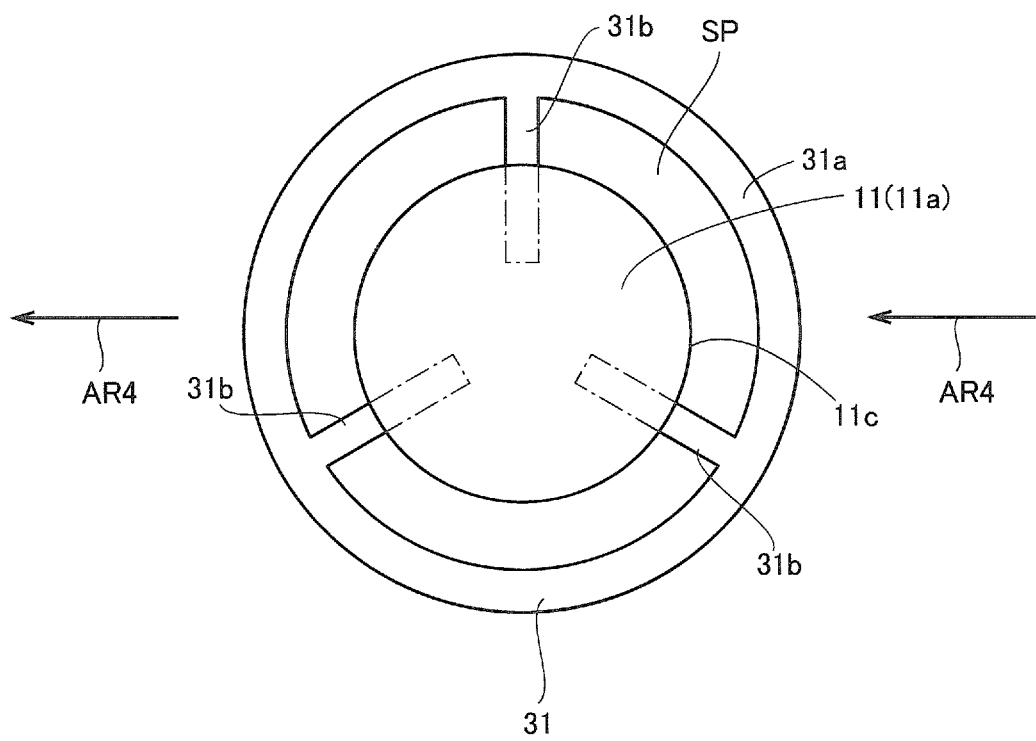
FIG. 19 is a plan view showing an example of a method of holding the Si substrate 11 in the CVD apparatus according to the second embodiment of the present invention.

FIG. 19 is a plan view showing an example of a method of holding the Si substrate 11 in the CVD apparatus, according to the second embodiment of the present invention.

Referring to FIG. 19, the CVD apparatus includes a retaining part 31 for holding the Si substrate 11. The retaining part 31 includes a ring-like peripheral part 31a and a plurality (three in this case) of protrusions 31b equally spaced and placed at the inner peripheral side end portion of the peripheral part 31a. Each of the plurality of protrusions 31b is linear and protrudes toward the center of the peripheral part 31a. The Si substrate 11 is placed on the tip of each of the plurality of protrusions 31b, so that the obverse side 11a faces upward. The reaction gas is flowed in the direction indicated by the arrow AR4 on the obverse side 11a of the Si substrate 11. A part of the reaction gas flows around the side surface 11c and the reverse side 11b of the Si substrate 11 through the space SP between the peripheral part 31a and the plurality of protrusions 31b. As a result, a SiC film 12 continuous to the obverse side 11a, the side surface 11c, and the peripheral parts of the reverse side 11b of the Si substrate 11 is formed.

The configuration and method for manufacturing of compound semiconductor substrate 1 other than the above are the same as the configuration and the method for manufacturing of the compound semiconductor substrate in the first embodiment. Therefore, description thereof will not be repeated.

According to the present embodiment, it is possible to obtain the same effect as in the first embodiment. In addition, the Si substrate 11 can be wet-etched by using the SiC film 12 turned around in the reverse side 11b of the Si substrate 11 and formed as a mask. Therefore, it is unnecessary to form a recessed part in the Si substrate 11 in another step from the step of forming the SiC film 12, or to form a pattern by lithography. As a result, the compound semiconductor substrate 1 can be manufactured by a simple method. The compound semiconductor substrate 1 can be manufactured in a short period of time and at low cost.

Third Embodiment

Figure 20:
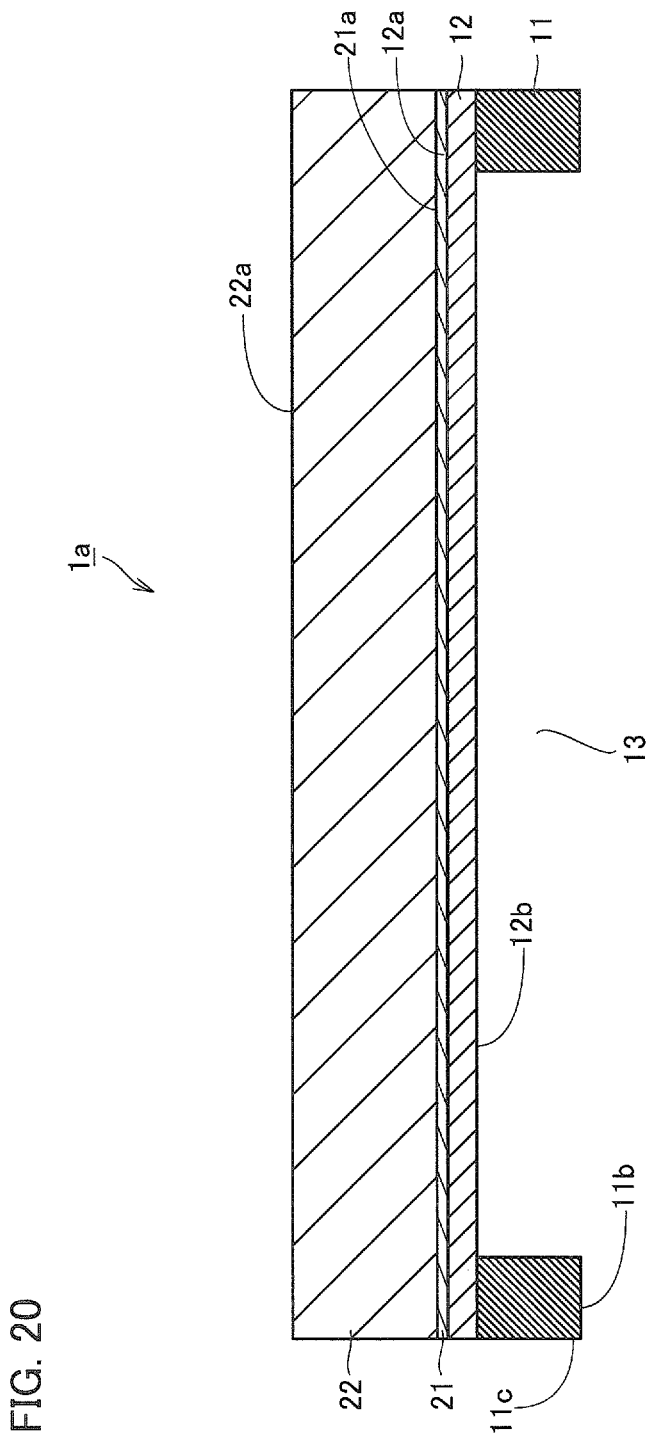
FIG. 20 is a cross-sectional view showing a configuration of a compound semiconductor substrate 1a in a third embodiment of the present invention.

FIG. 20 is a cross-sectional view showing the configuration of the compound semiconductor substrate 1a in the third embodiment of the present invention. FIG. 20 is a cross-sectional view obtained by cutting with a plane perpendicular to the obverse side 22a of the GaN film 22.

Referring to FIG. 20, the compound semiconductor substrate 1a in the present embodiment further includes an AlN film 21 and a GaN film 22.

The AlN film 21 is formed on the obverse side 12a (an example of one principal surface of SiC film) of the SiC film 12. The AlN film 21 is a buffer layer for improving the wettability between the SiC film 12 and the GaN film 22. The AlN film 21 has a thickness of, for example, 5 nanometers or more and 15 nanometers or less. The AlN film 21 preferably has a thickness of 5 nanometers or more and 9 nanometers or less. The AlN film 21 more preferably has a thickness of 7 nanometers or more and 9 nanometers or less.

The GaN film 22 is formed on the obverse side 21a of the AlN film 21. The GaN film 22 has a thickness of, for example, 1500 nanometers or more and 3000 nanometers or less, and preferably has a thickness of 1500 nanometers or more and 2500 nanometers or less. The GaN film 22 may have a conductivity type of p-type or n-type. At least a part of the GaN film 22 may be doped with C, Fe or the like.

The configuration of the compound semiconductor substrate Ta other than the above is similar to the configuration of the compound semiconductor substrate 1 in the first embodiment shown in FIGS. 1 and 2. Identical members are given the same reference numeral, and description thereof will not be repeated.

Next, method for manufacturing of the compound semiconductor substrate lain this embodiment will be described.

First, using the same method for manufacturing as the method for manufacturing in the first embodiment, the compound semiconductor substrate 1 shown in FIG. 1 is obtained. As an example, the compound semiconductor substrate 1 includes a ring-shaped Si substrate 11 having an outer diameter of 100 mm and an inner diameter of 80 mm, and a SiC film 12 having a thickness of 160 nanometers formed on the Si substrate 11.

Next, on the obverse side 12a of the SiC film 12, a GaN film 22 is formed via an extremely thin AlN film 21. Here, using the MOCVD (Metal Organic Chemical Vapor Deposition) method, a case where the AlN film 21 and the GaN film 22 are sequentially heteroepitaxially grown on the obverse side 12a of the SiC film 12 will be described.

Figure 21:
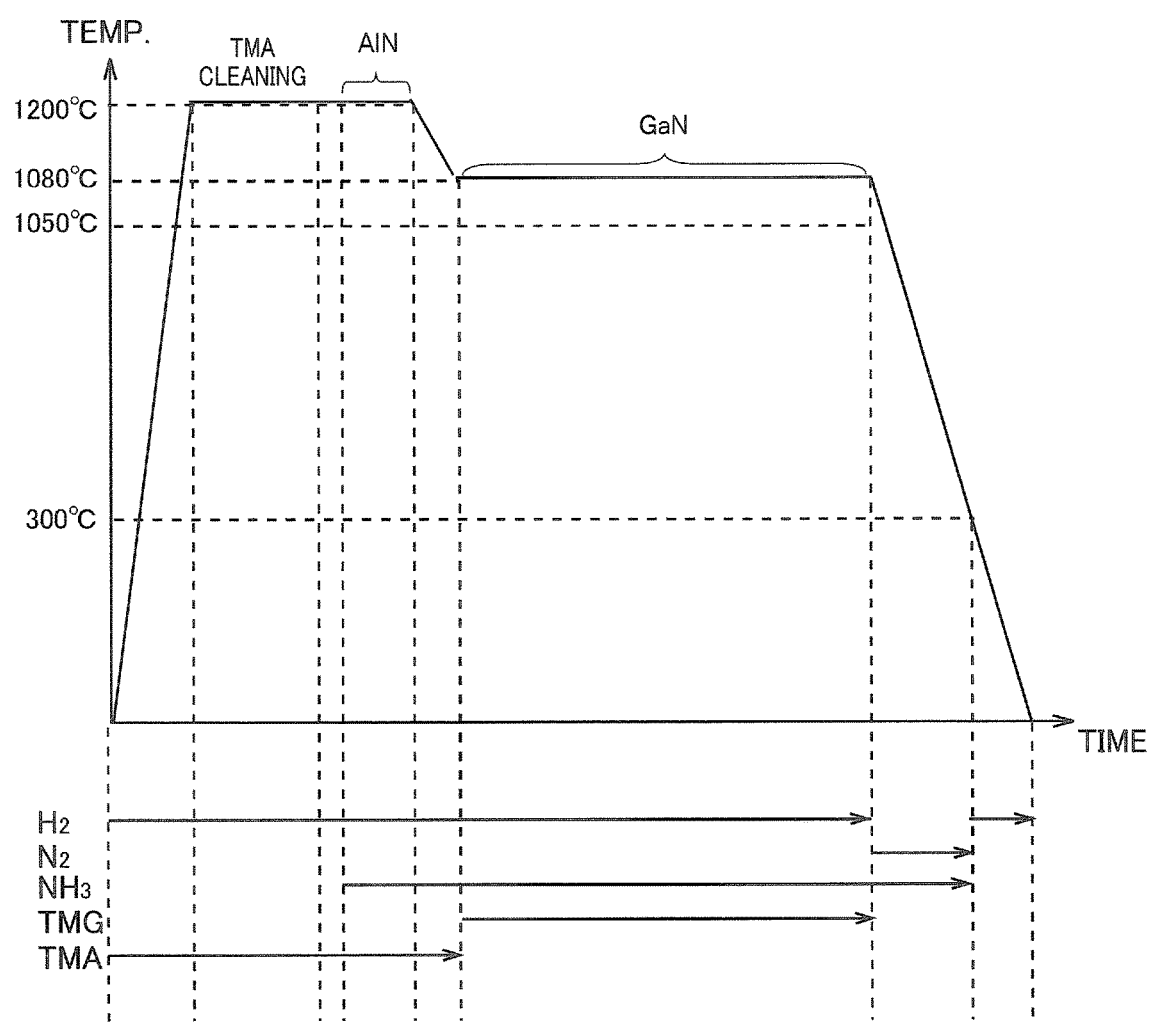
FIG. 21 is a graph illustrating an example of the film forming condition of the AlN film 21 and the GaN film 22 in the third embodiment of the present invention.

FIG. 21 is a graph illustrating an example of the film forming condition of the AlN film 21 and the GaN film 22 in the third embodiment of the present invention.

Referring to FIG. 21, after cleaning with TMA (trimethylaluminum: Al $(CH_3)_3$), the AlN film 21 is formed, for example, at a temperature of 1000 to 1300 degree Celsius (1200 degree Celsius in FIG. 21), and in a time of about 1 to 60 minutes. For example, TMA is used as a raw material gas of Al, and ammonia ($NH_3$) is used as a raw material gas of N, for example.

After forming the AlN film 21, the GaN film 22 is formed, for example, at a temperature of 900 to 1200 degree Celsius (1080 degree Celsius in FIG. 21), and in a time of about 5 to 200 minutes. For example, TMG (trimethyl gallium: Ga $(CH_3)_3$) is used as a raw material gas of Ga, and ammonia is used as a raw material gas of N, for example. By the above steps, the compound semiconductor substrate 1a shown in FIG. 20 is obtained.

In compound semiconductor substrate 1a, after formation of the GaN film 22 (after completion of the compound semiconductor substrate Ta), the Si substrate 11 may be completely removed by using nitrohydrofluoric acid or the like. Also, if necessary, a graded layer (for example, an AlGaN film in which a compositional ratio of Al gradually decreases from the AlN film 21 toward the GaN film 22) may be provided between the AlN film 21 and the GaN film 22. Further, an intermediate layer (which is made of an Al film or an AlGaN film, for example) may be provided in the GaN film 22.

Generally, when a GaN film is directly formed on a Si substrate, large warpage and cracks are generated due to the difference in physical properties (lattice constant and thermal expansion coefficient) between Si and GaN. In order to avoid such a situation, a complicated and thick buffer film has conventionally been formed between the Si substrate and the GaN film.

According to this embodiment, a portion of the Si on the lower side of the SiC film 12 is removed, so that the adverse effect on the GaN by the difference in physical properties between Si and GaN is reduced. The difference in physical properties between SiC and GaN is smaller than the difference in physical properties between Si and GaN, and the thickness of SiC is smaller than the thickness of Si. For this reason, the adverse effect of the foundation SiC film 12 on the GaN film 22 is small. As a result, it is possible to obtain a high-quality GaN film 22 with less dislocation and less warpage/cracks, by merely providing a simple buffer layer (AlN film 21).

Further, a GaN self-supporting substrate may be obtained by thickly forming the GaN film 22 to the order of hundreds of micrometers thick. In this case, the number of defects contained in the GaN film 22 is very small. In the case where the GaN film 22 is made thick to the order of several hundred micrometers, the growth time of the GaN film 22 may be shortened by using the H-VPE (Hydride Vapor Phase Epitaxy) method with a high growth rate. Also, the an MOCVD method and the H-VPE method may be combined.

Further, when the compound semiconductor substrate 1a is used for applications such as power devices and high frequency devices, a device layer such as an HEMT (High Electron Mobility Transistor) layer or the like may be formed on the obverse side 22a of the GaN film 22, after completing the compound semiconductor substrate 1a. (Specifically, the device layer includes an AlGaN barrier layer, an AlN spacer layer, a GaN cap layer, and the like).

When compound semiconductor substrate 1a is used for applications such as power devices and high frequency devices, since a part of the Si on the lower side of the SiC film 12 has been removed, the SiC film 12 can be directly adhered to a heat sink made of an insulating ceramic (such as AlN) having high thermal conductivity. As a result, dissipation of heat can be improved, and a device handling high power can be realized.

Furthermore, when the compound semiconductor substrate Ta is used for a light emitting device such as an LED (Light Emitting Diode), a device layer such as an MQW layer (quantum well layer) including a repeating structure of an In GaN layer and a GaN layer and a p-type GaN layer (Mg-doped GaN layer) may be provided, on the obverse side 22a of the GaN film 22, after completing the compound semiconductor substrate Ta.

When compound semiconductor substrate 1a is used for light emitting devices, since a part of the Si on the lower side of the SiC film 12 is removed, absorption of visible light by Si can be avoided. As a result, it is possible to extract light from the reverse side of the SiC film 12, and it becomes possible to realize a high luminance light emitting device.

Fourth Embodiment

Figure 22:
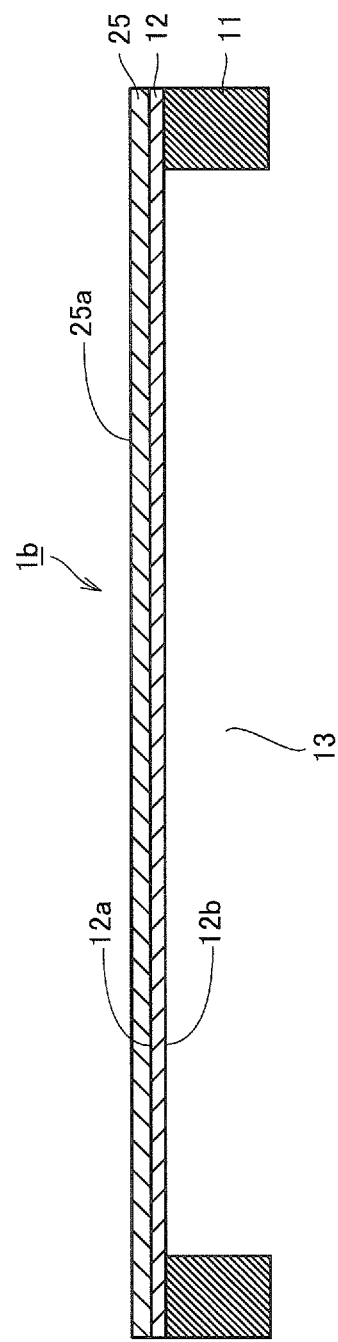
FIG. 22 is a cross-sectional view showing a configuration of a compound semiconductor substrate 1b in the fourth embodiment of the present invention.

FIG. 22 is a cross-sectional view showing the configuration of the compound semiconductor substrate 1b in the fourth embodiment of the present invention. Note that FIG. 22 is a cross-sectional view obtained by cutting with a plane perpendicular to the obverse side 25a of the graphene film 25.

Referring to FIG. 22, the compound semiconductor substrate 1b in this embodiment further includes a graphene film 25.

The graphene film 25 is formed on the obverse side 12a (an example of one principal surface of SiC film) of the SiC film 12. The graphene film 25 may consist of a single layer graphene film. The graphene film 25 may be made of laminated multilayer graphene films (that is, a graphite film). The graphene film 25 has a thickness of 0.3 nanometers or more and 1 micrometer or less, for example.

The configuration of the compound semiconductor substrate 1b other than the above is the same as that of the compound semiconductor substrate 1 in the first embodiment shown in FIGS. 1 and 2. Identical members are given the same reference numerals, and description thereof will not be repeated.

Next, method for manufacturing of compound semiconductor substrate 1b in this embodiment will be described.

First, the structure shown in FIG. 8 is obtained by using the method for manufacturing similar to the method for manufacturing in the first embodiment. As an example, the structure shown in FIG. 8 includes a Si substrate 11 having an outer diameter of 100 mm and an inner diameter of 80 mm, and a SiC film 12 having a thickness of 50 nanometers formed on the Si substrate 11.

Figure 23:
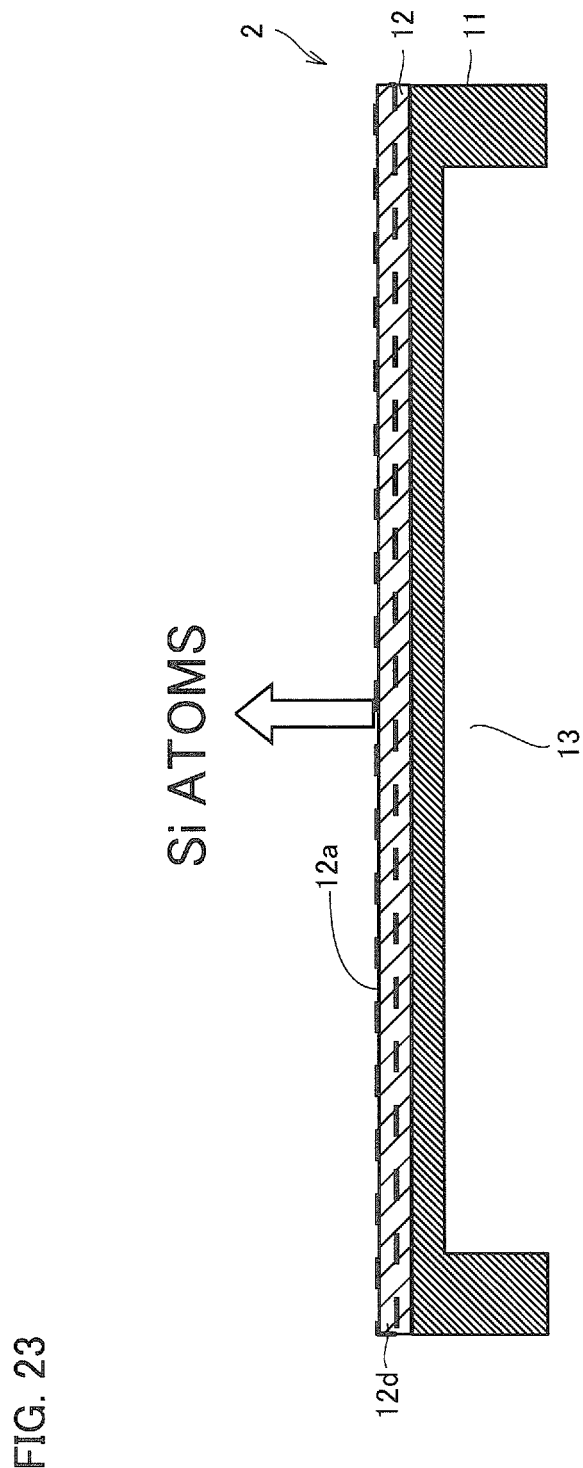
FIG. 23 is a cross-sectional view showing a first step of method for manufacturing of compound semiconductor substrate 1b in the fourth embodiment of the present invention.

Referring to FIG. 23, the structure shown in FIG. 8 is placed in a container such as a furnace, for example, heat treatment (annealing) is performed on compound semiconductor substrate 1 at a temperature of 1200 degree Celsius for 1 hour in an $H_2$ atmosphere. As a result, the bond between the Si atoms and the C atoms, which constitutes the portion 12d close to the obverse side 12a (the portion surrounded by the dotted line) in the SiC film 12, is decomposed, and the Si atoms desorb. As a result, only the SiC of the upper portion 12d of the SiC film 12 changes to graphene film 25.

Instead of changing part of SiC film 12 to graphene film 25, it may be formed by laminating a graphene film 25 on the obverse side 12a of the SiC film 12 by the following method. Specifically, a solvent in which graphene is dispersed is applied to the obverse side 12a of the SiC film 12 by a method such as spin coating or spray coating. When the spin coating method is used, the structure shown in FIG. 8 is fixed to the holding platform HP (FIG. 10) such that the obverse side 12a of the SiC film faces upward and the holding platform HP is rotated. As a solvent in which graphene is dispersed, a graphene/flour dispersion such as MEK (methyl ethyl ketone) (polymeric boundary face active agent) [GF9MEK-DS] (made by Incubation Alliance Co.) can be used. After applying a solvent in which graphene is dispersed, heat treatment is performed, for example, at 400 degrees Celsius for 20 minutes. As a result, the solvent evaporates, a graphene film 25 baked and solidified is formed by laminating on the SiC film 12. In this method, SiC film 12 is not graphenated.

Figure 24:
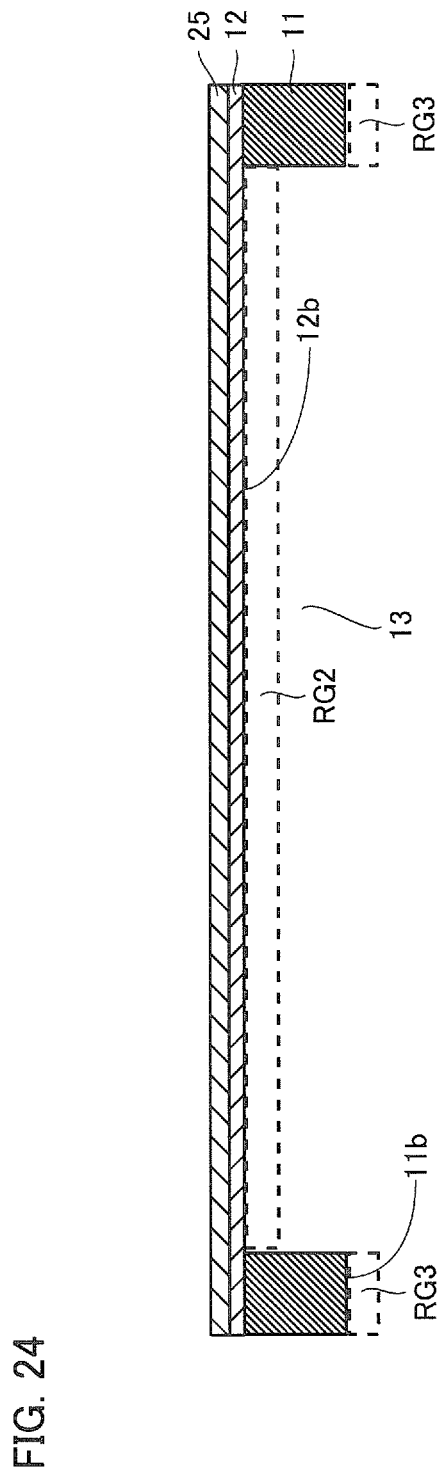
FIG. 24 is a cross-sectional view showing a second step of method for manufacturing of compound semiconductor substrate 1b in the fourth embodiment of the present invention.

Next, referring to FIG. 24, the bottom surface RG2 of the recessed part 13 of the Si substrate 11 and the Si of the peripheral part RG3 of the reverse side 11b of the Si substrate 11 are removed by wet etching. As a result, the reverse side 12b of the SiC film 12 is exposed on the bottom surface of the recessed part 13. By the above steps, a compound semiconductor substrate 1b shown in FIG. 22 is obtained.

As an alternative method for manufacturing of the present embodiment, after removing the bottom surface RG2 of the recessed part 13 of the Si substrate 11, a part of the SiC film 12 may be changed to a graphene film 25. In this case, since Si atoms are released from both the obverse side 12a and the reverse side 12b of the SiC film 12, the graphene film 25 is formed on both the obverse side 12a and the reverse side 12b of the SiC film 12. Further, after removing the bottom surface RG2 of the recessed part 13 of the Si substrate 11, the graphene film 25 may be formed (laminated) on the obverse side 12a of the SiC film 12.

In compound semiconductor substrate Tb, after the formation of the graphene film 25 (after completion of the compound semiconductor substrate Tb), the Si substrate 11 may be completely removed by using fluoro-nitric acid or the like.

According to the present embodiment, a thin graphene film 25 can be obtained by using the thin SiC film 12 of the compound semiconductor substrate 1 in the first embodiment as a raw material. Graphene is excellent in mechanical strength and thermal properties. Therefore, when compound semiconductor substrate 1b is used as pellicle film, graphene film 25 plays a role of protecting SiC film 12. In particular, graphene has a negative coefficient of thermal expansion. Therefore, when compound semiconductor substrate 1b is used as a pellicle film, it is possible to avoid a situation where deflection occurs in the pellicle film, even when the temperature of the pellicle film rises due to EUV irradiation.

Fifth Embodiment

Figure 25:
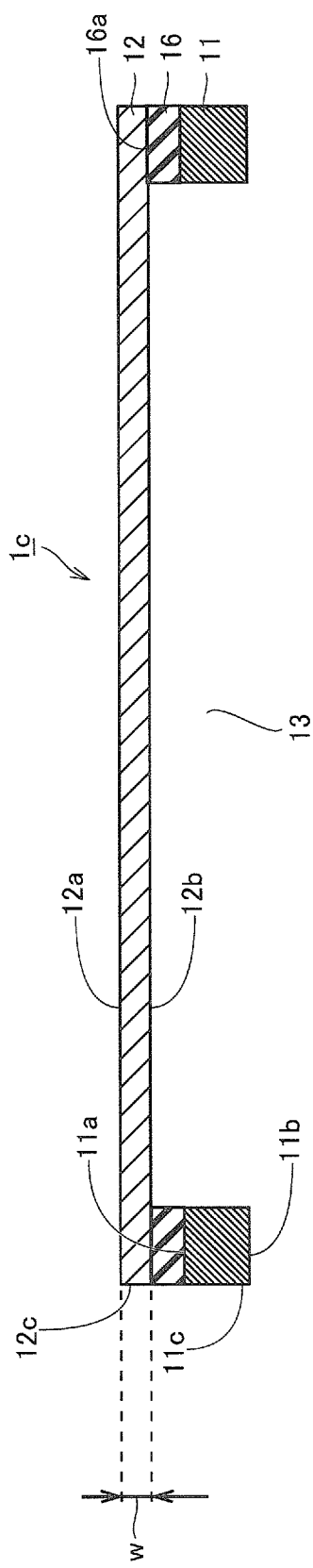
FIG. 25 is a cross-sectional view showing a configuration of compound semiconductor substrate 1c according to a fifth embodiment of the present invention.

FIG. 25 is a cross-sectional view showing the configuration of the compound semiconductor substrate 1c in the fifth embodiment of the present invention. FIG. 25 is a cross-sectional view obtained by cutting with a plane perpendicular to the obverse side 12a of the SiC film 12.

Referring to FIG. 25, the compound semiconductor substrate 1c in this embodiment further includes a Si oxide film 16. In this respect, this embodiment is different from the compound semiconductor substrate 1 in the first embodiment. The Si oxide film 16 is formed on the obverse side 11a of the Si substrate 11 and has the same planar shape as the Si substrate 11. The SiC film 12 is formed on the obverse side 16a (the obverse side 11a side of the Si substrate 11) of the Si oxide film 16.

The Si oxide film 16 is made of PSG (Phosphorus Silicate Glass), BPSG (Boron Phosphorus Silicate Glass), $SiO_2$, or the like. The Si oxide film 16 has a thickness of, for example, 100 nanometers or more and 2000 nanometers or less.

Next, method for manufacturing of compound semiconductor substrate 1c in this embodiment will be described with reference to FIGS. 26 to 30.

Figure 26:
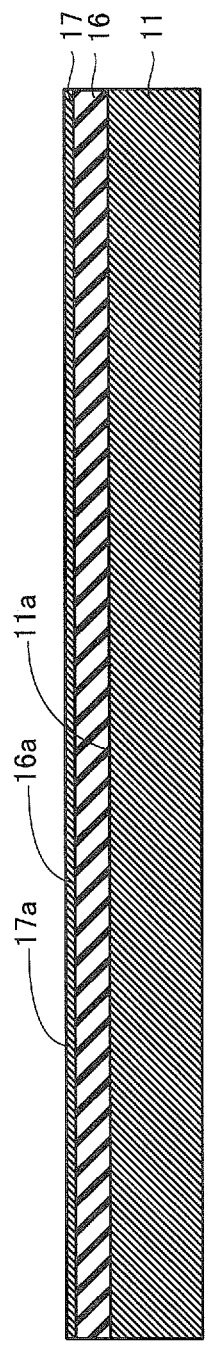
FIG. 26 is a cross-sectional view showing a first step of method for manufacturing of compound semiconductor substrate 1c in the fifth embodiment of the present invention.

Referring to FIG. 26, For example, a disc-shaped SOI (Silicon on Insulator) substrate (with no recessed part 13 formed) is prepared. The SOI substrate includes Si substrate 11, Si oxide film 16 made of $SiO_2$ formed on the obverse side 11a of the Si substrate 11, Si film 17 formed on the obverse side 16a of the Si oxide film 16. In order to form a good SiC film 18 without leaving the Si film 17 in the subsequent carbonize step, it is preferable that the Si film 17 has a thickness of 4 nanometers or more and 10 nanometers or less.

The Si film 17 may be thin-filmed so that the thickness of the Si film 17 falls within the above range. Film thinning of the Si film 17 may be performed as follows. For example, by heating the SOI substrate in an oxidizing atmosphere, the obverse side 17a of the Si film 17 is oxidized. Subsequently, the oxide formed on the obverse side 17a of the Si film 17 is removed by wet etching.

Figure 27:
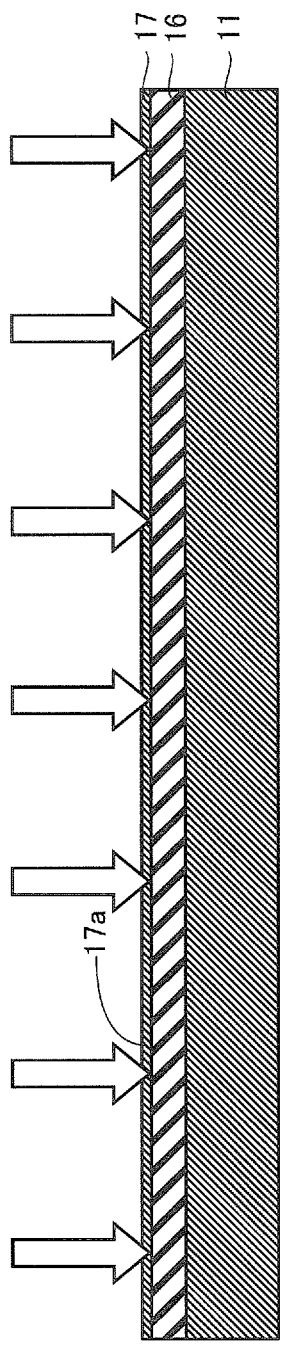
FIG. 27 is a cross-sectional view showing a second step of method for manufacturing of compound semiconductor substrate 1c in the fifth embodiment of the present invention.

Referring to FIG. 27, if necessary, ions of P (phosphorus), or ions of B (boron) and P may be introduced into the Si oxide film 16 from the obverse side 17a of the Si film 17. As a result, the composition of the Si oxide film 16 changes from $SiO_2$ not containing B or P to PSG or BPSG. Note that the introduction of the above ions may be omitted and the Si oxide film 16 may be formed of $SiO_2$ not containing B or P.

When forming the Si oxide film 16 of PSG, the introduction amount of P ions is $1*10^{15}/cm^2$ or more and $5*10^{18}/cm^2$ or less, and the doping amount of P atoms in Si oxide film 16 is preferably 5 atomic % or more and 7 atomic % or less. This makes it possible to sufficiently soften the Si oxide film 16 while suppressing an increase in hygroscopic property of the Si oxide film 16. The substrate temperature at the time of introduction of P ions is preferably 200 degrees Celsius or more and 550 degrees Celsius or less. This makes it possible to prevent the degradation of the crystallinity of the Si film 17. Further, the acceleration energy of P ions is preferably 5 keV or more and 30 keV or less. It is possible to maintain the crystallinity and an appropriate film thickness of the SiC film 18 to be formed later.

Figure 28:
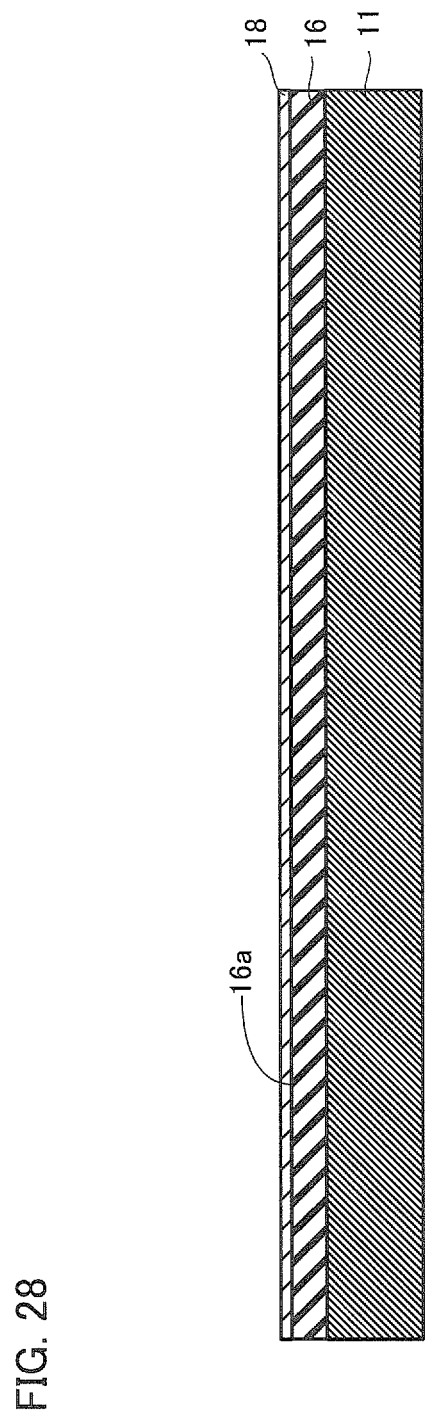
FIG. 28 is a cross-sectional view showing a third step of method for manufacturing of compound semiconductor substrate 1c in the fifth embodiment of the present invention.

Next, referring to FIG. 28, the Si film 17 is carbonized by heating the Si film 17 in a carbonize hydrogen-based gas atmosphere. As a result, the Si film 17 changes to SiC film 18. The temperature in the atmosphere is preferably 900 degrees Celsius to 1405 degrees Celsius. The carbonize hydrogen-based gas is propane gas, and hydrogen gas is preferably used as carrier gas. The flow rate of the propane gas is, for example, 10 sccm, and the flow rate of the hydrogen gas is, for example, 1000 sccm.

When the substrate is cooled after carbonizing of the Si film 17, tensile stress due to a difference in shrinkage ratio between the SiC film 18 and the Si substrate 11 is generated in the SiC film 18. However, by interposing the Si oxide film 16 which is a relatively soft material, the tensile stress inside the SiC film 18 can be relieved.

Note that the Si film 17 may not be completely carbonized, and a part thereof may be left near the boundary face with the Si oxide film 16. In this case, the flatness of the boundary face between the Si oxide film 16 and the SiC film 18 can be improved by the Si film 17 interposed between the Si oxide film 16 and the SiC film 18. The SiC film 18 is formed on the obverse side 16a side of the Si oxide film 16 regardless of whether the Si film 17 is completely carbonized or not.

Subsequently, referring to FIG. 29, using SiC film 18 as a foundation film, SiC film 19 is formed by epitaxial growth. As a result, SiC film 12 made of SiC films 18 and 19 is obtained.

The epitaxial growth of SiC film 19 is performed by heating the substrate on which the SiC film 18 is formed to a temperature of 900 degrees Celsius or more and 1405 degrees Celsius or less, while supplying a source gas composed of, for example, a methylsilane-based gas at a flow rate of about 1.0 sccm.

Even when the substrate is cooled after epitaxial growth of SiC film 19, tensile stress due to the difference in shrinkage ratio between SiC film 12 and Si substrate 11 occurs in SiC film 12. However, by interposing the Si oxide film 16 which is a relatively soft material, the tensile stress inside the SiC film 12 can be relieved.

The SiC film 12 may be formed only by carbonize of the Si film 17, without performing epitaxial growth of the Si film 19.

Figure 30:
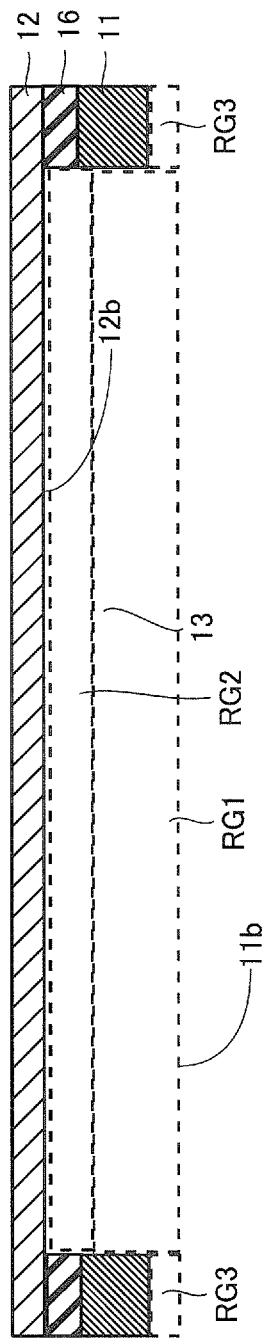
FIG. 30 is a cross-sectional view showing a fifth step of method for manufacturing of compound semiconductor substrate 1c in the fifth embodiment of the present invention.

Subsequently, referring to FIG. 30, by removing the Si of the central part RG1 of the reverse side 11b of the Si substrate 11 in the same manner as in the first embodiment, a recessed part 13 is formed. In forming the recessed part 13, the Si of the central part RG1 may be completely removed, and the recessed part 13 may be formed at a depth reaching the Si oxide film 16. This provides the intermediary body 2.

Thereafter, in the same manner as in the first embodiment, the Si substrate 11 and the Si oxide film 16 of the bottom portion RG2 of the recessed part 13 (the Si oxide film 16 at the bottom RG2 of the recessed part 13, if the Si substrate 11 of the bottom RG2 of the recessed part 13 is completely removed during the formation of the recessed part 13), and the Si of the peripheral part RG3 of the reverse side 11b of the Si substrate 11 are removed by wet etching. The reverse side 12b of the SiC film 12 is exposed. Generally, liquid chemical (mixed acid etc.) used for wet etching of Si has a property of dissolving Si oxide film. Therefore, the Si oxide film 16 can be removed by the same method as the wet etching of Si in the first embodiment. By the above steps, a compound semiconductor substrate 1c shown in FIG. 25 is obtained.

The configuration of the compound semiconductor substrate 1c and the method for manufacturing other than the above are the same as those of the compound semiconductor substrate 1 and method for manufacturing in the first embodiment. Therefore, the same members are denoted by the same reference numerals, and description thereof will not be repeated.

According to the present embodiment, it is possible to obtain the same effect as in the first embodiment. In addition, by interposing the Si oxide film 16 between the Si substrate 11 and the SiC film 12, the tensile stress inside the SiC film 12 can be relieved. As a result, breakage of the SiC film 12 at the time of manufacturing can be suppressed, and the production yield of the SiC film 12 can be improved.

As a modification of this embodiment, similar to the method shown in FIGS. 4 to 8 of the first embodiment, Si of the central part RG1 of the reverse side 11b of the Si substrate 11 is removed to form the recessed part 13, and then the SiC film 12 may be formed.

Further, instead of using the SOI substrate, a Si oxide film 16 may be formed on the obverse side 11a of the Si substrate 11. The structure of FIG. 29 may be created by forming the SiC film 12 on the obverse side 16a of the Si oxide film 16. In this case, the SiC film 12 may be formed on the obverse side 16a of the Si oxide film 16 by using the MBE method, the CVD method, or the like.

Sixth Embodiment

Figure 31:
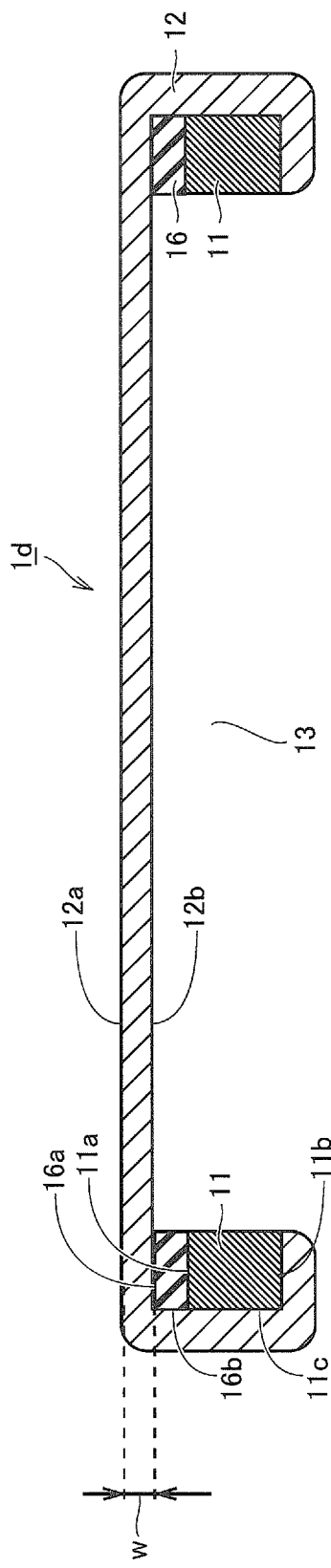
FIG. 31 is a cross-sectional view showing a configuration of compound semiconductor substrate 1d in a sixth embodiment of the present invention.

FIG. 31 is a cross-sectional view showing the configuration of the compound semiconductor substrate 1d in the sixth embodiment of the present invention. FIG. 31 is a cross-sectional view obtained by cutting with a plane perpendicular to the obverse side 12a of the SiC film 12.

Referring to FIG. 31, the compound semiconductor substrate 1d in the present embodiment is further provided with the Si oxide film 16. This is different from the compound semiconductor substrate 1 in the second embodiment. The Si oxide film 16 is formed on the obverse side 11a of the Si substrate 11 and has the same planar shape as the Si substrate 11. The SiC film 12 is formed on the obverse side 16a (the obverse side 11a side of the Si substrate 11) of the Si oxide film 16. The SiC film 12 is formed on the obverse side 16a and the side surface 16b of the Si oxide film 16 and on the peripheral part of the side surface 11c and the reverse side 11b of the Si substrate 11. The obverse side 16a and the side surface 16b of the Si oxide film 16, the peripheral parts of the side surface 11c and the reverse side 11b of the Si substrate 11 are completely covered by the continuous SiC film 12. A recessed part 13 is formed in the central part of the Si substrate 11 and the central part of the Si oxide film 16, and the reverse side 12b of the SiC film 12 is exposed at the bottom of the recessed part 13.

The Si oxide film 16 is made of PSG, BPSG, SiO$_2$ or the like, and has a thickness of, for example, 100 nanometers or more and 2000 nanometers or less.

Next, method for manufacturing of the compound semiconductor substrate 1d in this embodiment will be described with reference to FIGS. 32 and 33.

Figure 32:
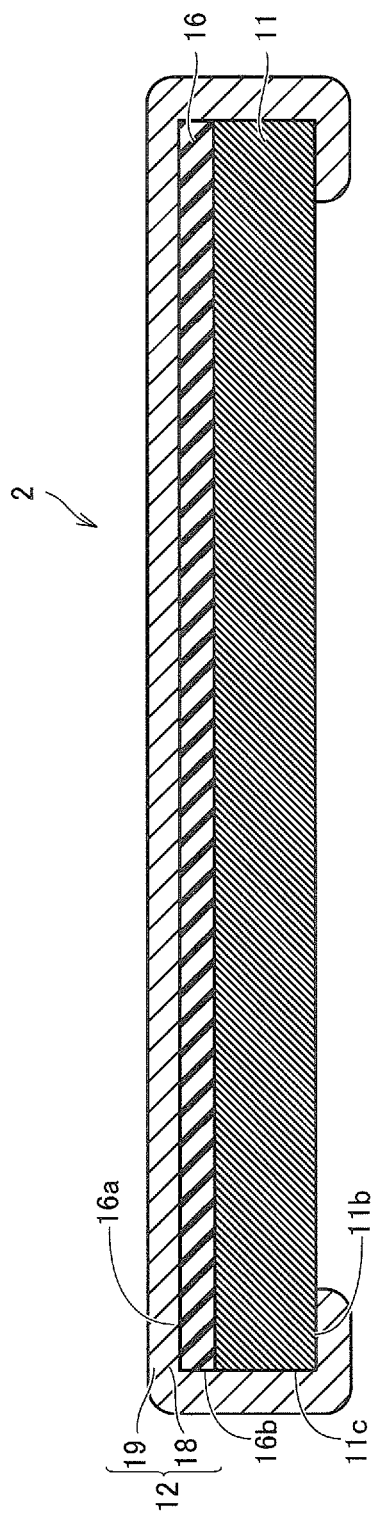
FIG. 32 is a cross-sectional view showing a first step of method for manufacturing of compound semiconductor substrate 1d in the sixth embodiment of the present invention.
Figure 33:
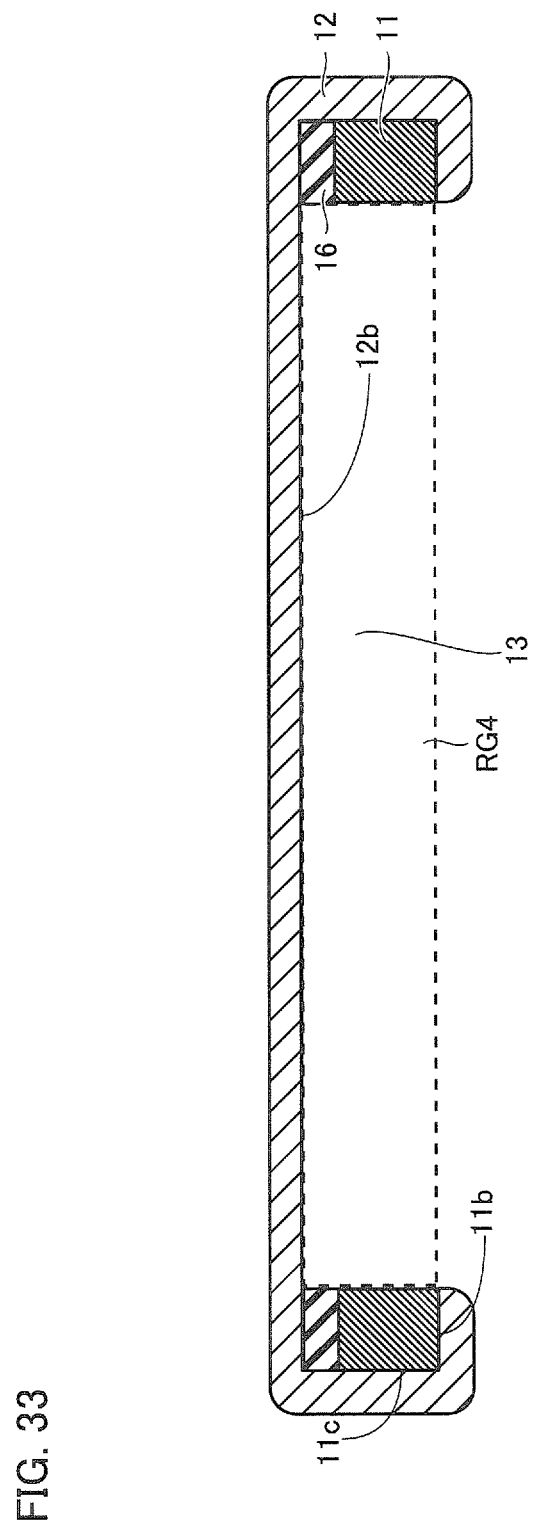
FIG. 33 is a cross-sectional view showing a second step of method for manufacturing of compound semiconductor substrate 1d in the sixth embodiment of the present invention.

Referring to FIG. 32, by using method for manufacturing similar to method for manufacturing in the fifth embodiment, the structure shown in FIG. 28 (structure in which SiC film 18 is formed) is obtained. Subsequently, SiC is epitaxially grown using SiC film 18 as a foundation film to form SiC film 19. As a result, a SiC film 12 of SiC films 18 and 19 is formed on the obverse side 16a of the Si oxide film 16.

When forming the SiC film 19, as in the case of the second embodiment, the Si substrate 11 is held, so that a part of the source gas supplied to the obverse side 11a of the Si substrate 11 also goes around the side surface 16b of the Si oxide film 16, the side surface 11c of the Si substrate 11, and the reverse side 11b of the Si substrate 11. As a result, the chemical reaction of the source gas occurs on the obverse side of the SiC film 18, the side surface 16b of the Si oxide film 16 and the peripheral part of the side surface 11c and the reverse side 11b of the Si substrate 11. A continuous SiC film 19 is formed on the obverse side 16a and the side surface 16b of the Si oxide film 16 and the peripheral part of the side surface 11c and the reverse side 11b of the Si substrate 11. As a result, the intermediary body 2 in this embodiment is obtained.

Subsequently, referring to FIG. 33, in the same manner as in the second embodiment, with the SiC film 12 formed in the peripheral part of the reverse side 11b of the Si substrate 11 as a mask, the central part RG4 of the Si substrate 11 and the Si oxide film 16 are removed by wet etching from the exposed portion of the reverse side 11b of the Si substrate 11. As a result of removing the Si and Si oxide films of the central part RG4, a recessed part 13 is formed on the reverse side 11b of the Si substrate. On the bottom surface of the recessed part 13, the reverse side 12b of the SiC film 12 is exposed. In this wet etching, the peripheral parts of the Si substrate 11 and the SiC film 12, which are portions covered with the SiC film 12 in plan view, are not removed. By the above steps, the compound semiconductor substrate 1 shown in FIG. 31 is completed.

The configuration of compound semiconductor substrate 1d and method for manufacturing other than the above are the same as those of compound semiconductor substrate 1 and method for manufacturing in the second embodiment. Therefore, the same reference numerals are given to the same members, the explanation will not be repeated.

According to the present embodiment, it is possible to obtain the same effects as those of the second embodiment. In addition, by interposing the Si oxide film 16 between the Si substrate 11 and the SiC film 12, the tensile stress inside the SiC film 12 can be relaxed. As a result, breakage of the SiC film 12 at the time of manufacturing can be suppressed, and the production yield of the SiC film 12 can be improved.

Seventh Embodiment

Figure 34:
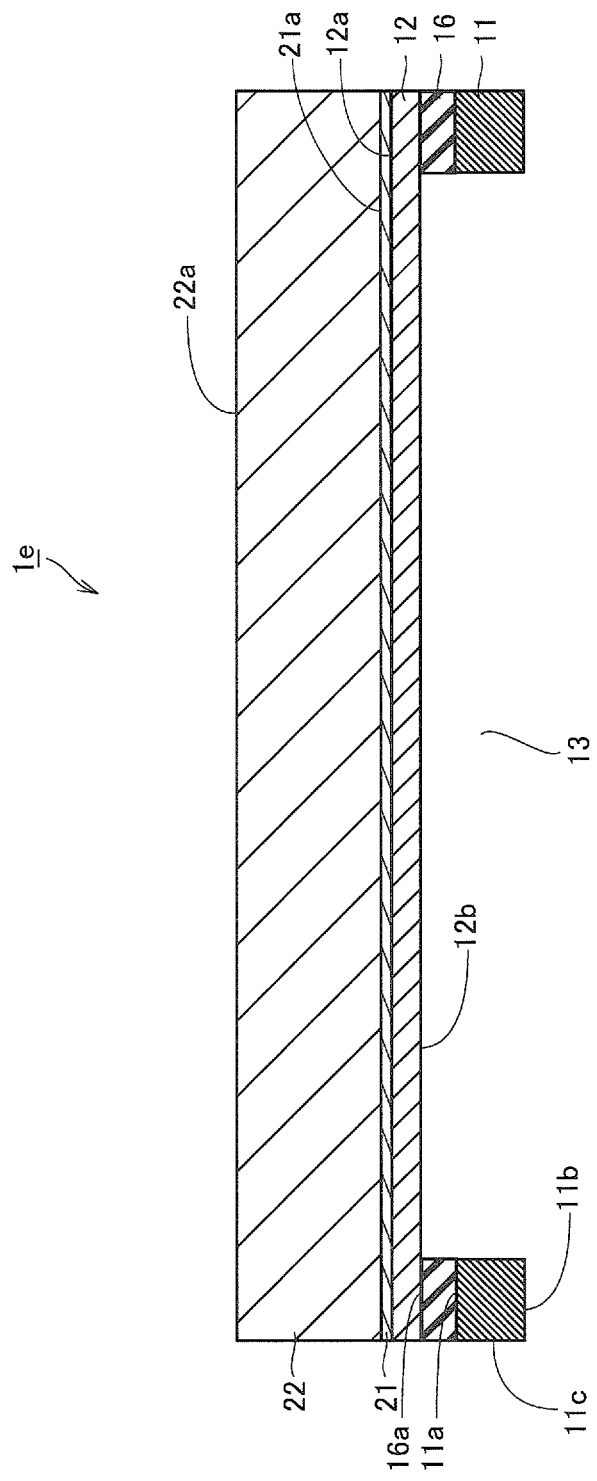
FIG. 34 is a cross-sectional view showing a configuration of compound semiconductor substrate 1e in a seventh embodiment of the present invention.

FIG. 34 is a cross-sectional view showing the configuration of the compound semiconductor substrate 1e in the seventh embodiment of the present invention. FIG. 34 is a cross-sectional view obtained by cutting with a plane perpendicular to the obverse side 22a of the GaN film 22.

Referring to FIG. 34, the compound semiconductor substrate 1e in the present embodiment is further provided with a Si oxide film 16. This is different from the compound semiconductor substrate 1a in the third embodiment. The Si oxide film 16 is formed on the obverse side 11a of the Si substrate 11 and has the same planar shape as the Si substrate 11. The SiC film 12 is formed on the obverse side 16a (the obverse side 11a side of the Si substrate 11) of the Si oxide film 16.

The Si oxide film 16 is made of PSG, BPSG, SiO$_2$ or the like, and has a thickness of, for example, 100 nanometers or more and 2000 nanometers or less.

Next, method for manufacturing of compound semiconductor substrate 1e in this embodiment will be described.

First, using method for manufacturing similar to method for manufacturing in the fifth embodiment, the compound semiconductor substrate 1c shown in FIG. 25 is obtained. Next, using method for manufacturing similar to method for manufacturing in the third embodiment, an AlN film 21 and a GaN film 22 are laminated in this order on the obverse side 12a of the SiC film 12. By the above steps, a compound semiconductor substrate 1e is obtained.

The configuration of the compound semiconductor substrate 1e and method for manufacturing other than the above are the same as those of the compound semiconductor substrate 1a and the method for manufacturing in the third embodiment. Therefore, the same members are denoted by the same reference numerals, and description thereof will not be repeated.

According to the present embodiment, the same effects as those of the third embodiment can be obtained. In addition, by interposing the Si oxide film 16 between the Si substrate 11 and the SiC film 12, the tensile stress inside the SiC film 12 can be relaxed. As a result, breakage of the SiC film 12 at the time of manufacturing can be suppressed, and the production yield of the SiC film 12 can be improved.

Eighth Embodiment

Figure 35:
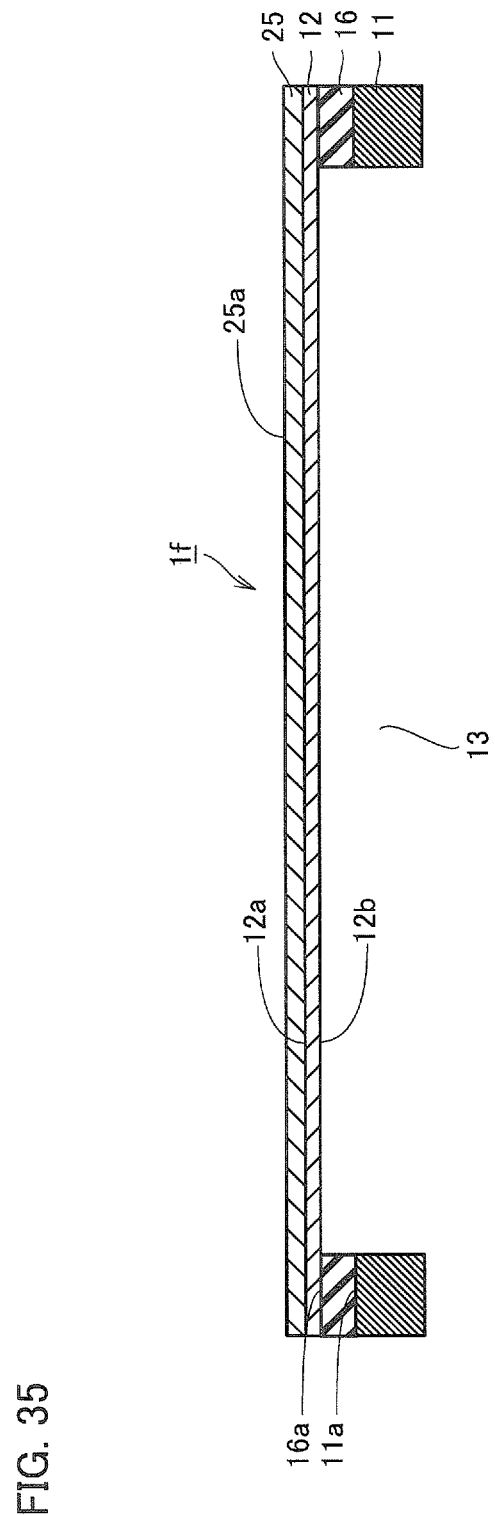
FIG. 35 is a cross-sectional view showing a configuration of compound semiconductor substrate 1f in an eighth embodiment of the present invention.

FIG. 35 is a cross-sectional view showing the configuration of the compound semiconductor substrate 1f in the eighth embodiment of the present invention. Note that FIG. 35 is a cross-sectional view obtained by cutting with a plane perpendicular to the obverse side 25a of the graphene film 25.

Referring to FIG. 35, the compound semiconductor substrate 1f in the present embodiment is further provided with the Si oxide film 16. This is different from the compound semiconductor substrate 1b in the fourth embodiment. The Si oxide film 16 is formed on the obverse side 11a of the Si substrate 11 and has the same planar shape as the Si substrate 11. The SiC film 12 is formed on the obverse side 16a (the obverse side 11a side of the Si substrate 11) of the Si oxide film 16.

The Si oxide film 16 is made of PSG, BPSG, SiO$_2$ or the like, and has a thickness of, for example, 100 nanometers or more and 2000 nanometers or less.

Next, method for manufacturing of compound semiconductor substrate 1f in this embodiment will be described with reference to FIGS. 36 and 37.

Figure 29:
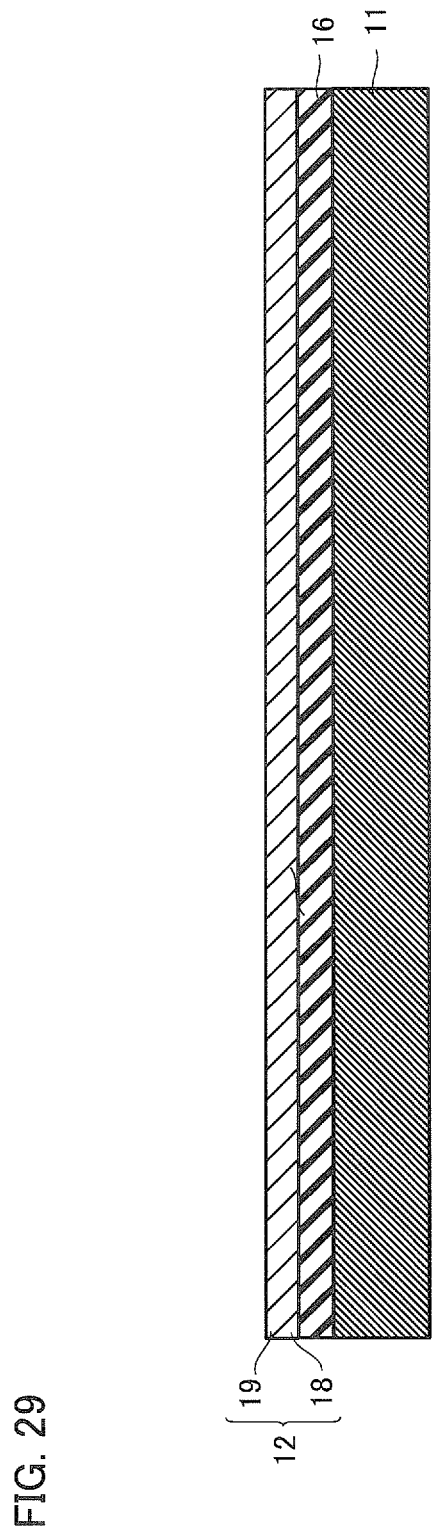
FIG. 29 is a cross-sectional view showing a fourth step of method for manufacturing of compound semiconductor substrate 1c in the fifth embodiment of the present invention.
Figure 36:
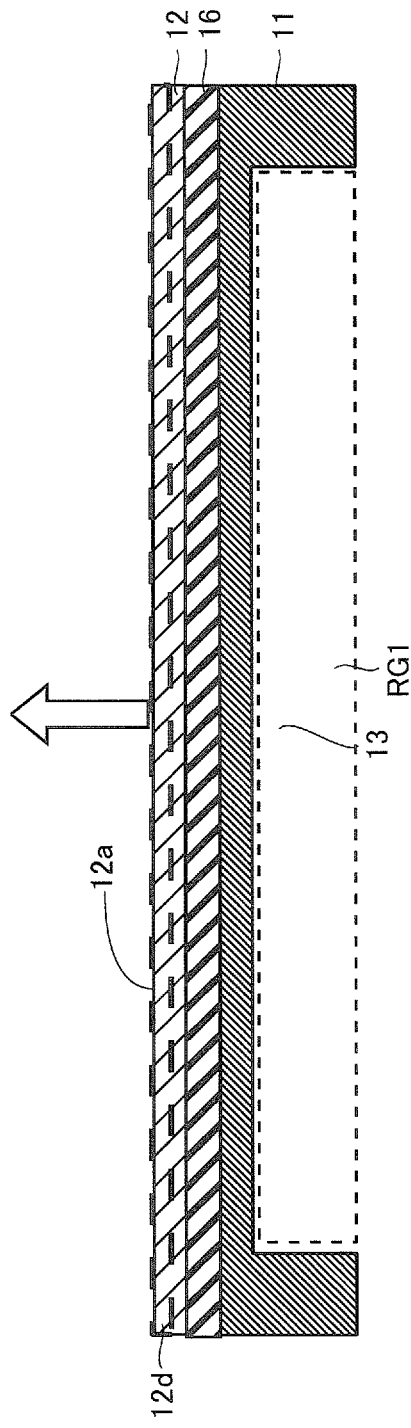
FIG. 36 is a cross-sectional view showing a first step of method for manufacturing of compound semiconductor substrate 1f in the eighth embodiment of the present invention.
Figure 37:
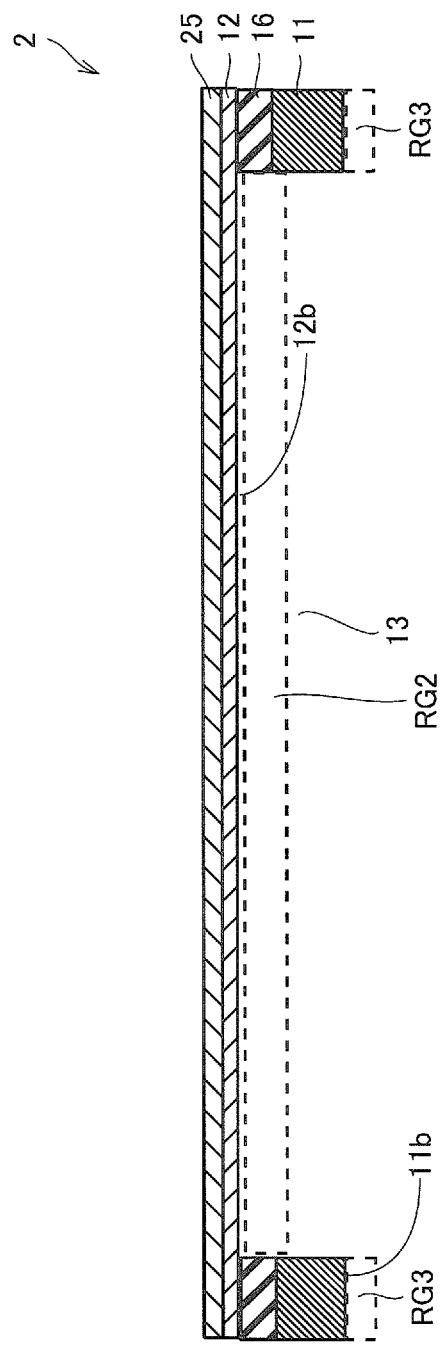
FIG. 37 is a cross-sectional view showing a second step of method for manufacturing of compound semiconductor substrate 1f in the eighth embodiment of the present invention.

First, referring to FIG. 36, using method for manufacturing similar to method for manufacturing in the fifth embodiment, the structure shown in FIG. 29 is generated, and Si of the central part RG1 of the reverse side 11b of the Si substrate 11 is removed to form a recessed part 13.

Next, using the same method as in the fourth embodiment, SiC of the upper portion 12d of the SiC film 12 is changed to a graphene film 25. This makes intermediary body 2.

Instead of changing part of SiC film 12 to graphene film 25, a solvent in which graphene is dispersed may be applied to the obverse side 12a of the SiC film 12 by a method such as spin coating or spray coating, and heat treatment is performed, graphene film 25 may be formed on SiC film 12.

Subsequently, referring to FIG. 37, in the same manner as in the fourth embodiment, Si and SiC of the bottom portion RG2 of the recessed part 13 and Si of the peripheral part RG3 of the reverse side 11b of the Si substrate 11 are removed by wet etching, the reverse side 12b of the SiC film 12 is exposed. By the above steps, the compound semiconductor substrate 1f shown in FIG. 35 is obtained.

The configuration of the compound semiconductor substrate 1f and the method for manufacturing other than the above are the same as those of the compound semiconductor substrate 1b and the method for manufacturing in the fourth embodiment. Therefore, the same members are denoted by the same reference numerals, and description thereof will not be repeated.

According to the present embodiment, it is possible to obtain the same effects as those of the fourth embodiment. In addition, by interposing the Si oxide film 16 between the Si substrate 11 and the SiC film 12, the tensile stress inside the SiC film 12 can be relaxed. As a result, breakage of the SiC film 12 at the time of manufacturing can be suppressed, and the production yield of the SiC film 12 can be improved.

Ninth Embodiment

Figure 38:
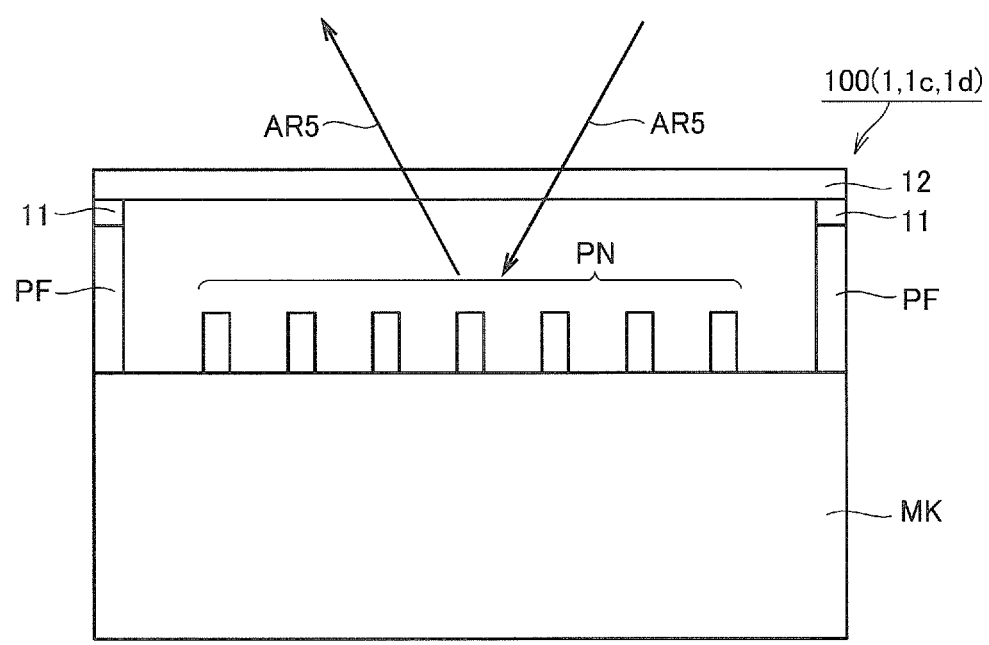
FIG. 38 is a cross-sectional view showing an example of how to use the compound semiconductor substrate 1, 1c or 1d, in the ninth embodiment of the present invention.

FIG. 38 is a cross-sectional view showing an example of how to use the compound semiconductor substrate 1, 1c or 1d in the ninth embodiment of the present invention.

Referring to FIG. 38, in the present embodiment, the compound semiconductor substrate 1, 1c, or 1d of the first, second, fifth, or sixth embodiment is used as the pellicle film 100 covering the mask MK. The surface of the mask MK is provided with a pattern PN for shielding the exposure light and a pellicle frame PF for supporting the pellicle film 100. The pellicle film 100 is fixed to the pellicle frame PF by adhesion or the like with the mask MK side is the Si substrate 11 side and the opposite side to the mask MK is the SiC film 12 side. The compound semiconductor substrate 1 may be processed according to the shape of the mask MK or pellicle frame PF, if necessary.

Note that it is also possible to use the compound semiconductor substrate 1b or if of the fourth or eighth embodiment as the pellicle film 100. In this case, the pellicle film 100 is fixed to the pellicle frame PF by adhesion etc. with the mask MK side as the Si substrate 11 side and the opposite side to the mask MK side as the graphene film 25 side.

The pellicle film 100 is for preventing exposure troubles caused by foreign matter adhering to the mask MK at the time of exposure focusing on an object to be exposed (semiconductor substrate or the like). The exposure light penetrates the pellicle film 100 and enters the surface of the mask MK as indicated by an arrow AR5. Part of the exposure light that has passed through the gaps of the pattern PN is reflected by the surface of the mask MK, and penetrates pellicle film 100. Thereafter, the exposure light is irradiated onto a photoresist (not shown) applied to the surface of the exposure object.

As the exposure light, one having an arbitrary wavelength can be used. However, in order to realize a high resolution lithography technique, as exposure light, it is preferable to use EUV (Extreme Ultra-Violet) light having a wavelength of several ten nanometers to several nanometers. SiC and graphene are chemically stable as compared with Si, and have high transmittance and high light resistance to EUV light. For this reason, SiC or graphene is suitable as a pellicle film when EUV light is used as exposure light. In particular, by using compound semiconductor substrate 1 containing very thin SiC film 12 of 20 nanometers or more and 10 micrometers or less of the compound semiconductor substrate 1 of the first or second embodiment as pellicle film 100, a higher transmittance can be realized.

Example

The inventors of the present invention attempted to produce compound semiconductor substrates by each of the methods of the invention examples 1 and 2 and the comparative example, described below.

Invention Example 1: A Si substrate having a diameter of 4 inches and a thickness of 525 micrometers and a surface composed of (100) plane was prepared. Next, by the method shown in FIG. 19, with the Si substrate held, a SiC film with a thickness of 160 nanometers was formed on the surface of the Si substrate by CVD method. The SiC film was made of 3C—SiC single—crystal, and the surface was composed of (100) plane. The SiC film was also formed in the side surface of the Si substrate and in the region within 1 cm from the outer peripheral edge of the reverse side of the Si substrate.

Figure 39:
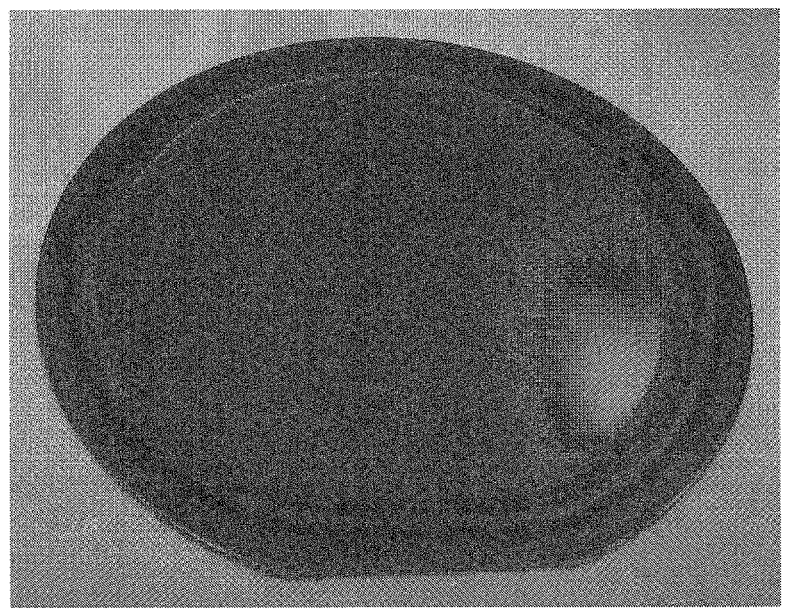
FIG. 39 is a photograph of the reverse side of a Si substrate during spin etching of an example of the present invention in one embodiment of the present invention.

Subsequently, a part of the Si substrate was removed by spin etching. Specifically, the Si substrate was rotated at a speed of 1000 rpm and liquid chemical was injected. As liquid chemical, mixed acid "Si-E" manufactured by Mitsubishi Chemical Corporation was used. When a dummy Si substrate was etched in advance under this spin etching conditions, an etching rate of 25 micrometer/min was obtained. When the Si substrate was observed during spin etching, growth and retention of bubbles were suppressed as shown in FIG. 39, and a very smooth reaction surface was observed. It is presumed that etching of Si proceeds uniformly.

After the above-described spin etching was performed for 21 minutes, pure water was injected into the Si substrate instead of liquid chemical, to rinse the Si substrate. The Si substrate was rinsed for 1 minute. Thus, a compound semiconductor substrate was obtained.

Observing the obtained compound semiconductor substrate, a ring—like SiC film was formed on the obverse side and the side surface, and in the peripheral part of the reverse side of the Si substrate. On the reverse side of Si substrate, Si was completely removed from the inside of a circular recessed part having a diameter of about 8 cm inside the ring-like SiC film, and a self-supporting SiC film was exposed at the bottom of the recessed part. When observed with X-ray, it was confirmed that the SiC film was a single crystal. As a result, a compound semiconductor substrate with a self-supporting (composed of SiC alone) large SiC film was obtained.

Invention Example 2: A compound semiconductor substrate was prepared by the same method for manufacturing as in the Invention Example 1, except that the thickness of the SiC film was set to 50 nanometers instead of 160 nanometers.

Observation of the obtained compound semiconductor substrate revealed that a ring—like SiC film was formed in the obverse side, the side surface, and the peripheral part of the reverse side of Si substrate. On the reverse side of Si substrate, Si was completely removed from the inside of the circular recessed part having a diameter of about 8 cm inside the ring-like SiC film. The self-supporting SiC film was exposed at the bottom of the recessed part. When observed with X-ray, it was confirmed that the SiC film was single crystal. As a result, a compound semiconductor substrate with a self-sustained large SiC film (composed of SiC alone) was obtained.

Figure 40:
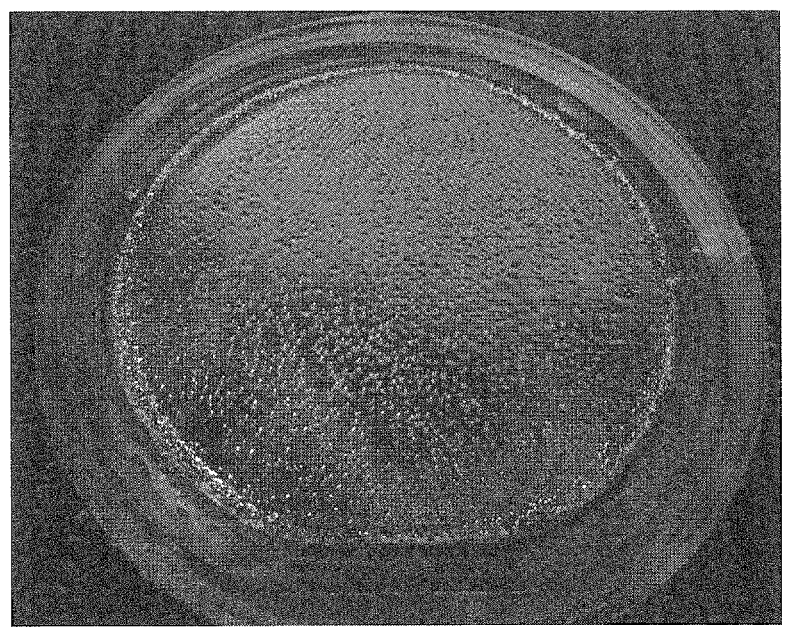
FIG. 40 is a photograph of the reverse side of a Si substrate during wet etching of a comparative example in one embodiment of the present invention.

Comparative Example: A Si substrate was prepared in the same manner as the invention example, and a SiC film was formed on the surface of Si substrate. Subsequently, part of the Si substrate was removed by wet etching by dipping the Si substrate and SiC film into the liquid chemical filled in the container. As the liquid chemical, the same as in the case of the invention example was used. As a result of observation of the Si substrate during the wet etching, as shown in FIG. 40, growth and retention of bubbles on the reaction surface of the Si substrate were observed. It is presumed that etching of Si progressed unevenly.

After immersing in the liquid chemical for 5 hours, the Si substrate and SiC film were removed from liquid chemical, followed by rinsing with pure water for 10 minutes. Thus, a compound semiconductor substrate was obtained.

Observation of the obtained compound semiconductor substrate revealed that a ring—like SiC film was formed on the obverse side and the side surface, and in the peripheral part of the reverse side of Si substrate. On the reverse side of the Si substrate, Si remained partly in the recessed part inside the ring-like SiC film. There was also a place where the SiC film was torn within the recessed part. The self-supporting SiC film was obtained only in the region of about 2 mm in diameter at maximum.

Others

In the above embodiment, the case where Si on the bottom surface of the recessed part 13 is removed by wet etching has been described, in the present invention, the portion removed by wet etching may be at least a part of the other of the principal surfaces of the Si substrate. The position, size, and shape of the part to be removed are arbitrary.

In the above embodiment, the GaN film 22 or the graphene film 25 is formed on the surface of the SiC film 12. When another film is formed on the surface of the SiC film, the film may be a film different from SiC.

The above-described embodiments can be combined with each other. For example, by combining the second embodiment and the third embodiment, the GaN film 22 may be formed on the compound semiconductor substrate 1 in which the obverse side 11a, the side surface 11c, and the peripheral parts of the reverse side 11b of the Si substrate 11 are completely covered by the continuous SiC film 12.

Further, by combining the second embodiment and the fourth embodiment, graphene film 25 may be formed on the compound semiconductor substrate 1 in which the obverse side 11a, the side surface 11c, and the peripheral parts of the reverse side 11b of the Si substrate 11 are completely covered by the continuous SiC film 12. In this case, immediately after step shown in FIG. 17, a part of SiC film 12 is changed to graphene film 25 (or graphene film 25 is laminated on obverse side 12a of SiC film 12), and then the step shown in FIG. 18 is performed.

Further, the modification of method for manufacturing of the first embodiment shown in FIGS. 14 and 15 and the fourth embodiment may be combined. In this case, immediately after step shown in FIG. 14, a part of SiC film 12 is changed to graphene film 25 (or graphene film 25 is laminated on surface 12a of SiC film 12). Thereafter, the step shown in FIG. 15 is carried out.

It is to be understood that the above-described embodiments and examples are illustrative in all respects and not restrictive. The scope of the present invention is defined not by the description above but by the claims, and it is intended that all modifications within the scope and the equivalent to the claims are included.

DESCRIPTION OF REFERENCE NUMBER 1, 1a, 1b, 1c, 1d, 1e, 1f compound semiconductor substrate
2 intermediary body
11 Si substrate
11a obverse side of Si substrate
11b reverse side of Si substrate
11c side surface of Si substrate
12, 18, 19 SiC film
12a obverse side of SiC film
12b reverse side of SiC film
12c side surface of SiC film
12d a part of SiC film
13 recessed part
14 mask layer
15 photoresist
16 Si oxide film
16a obverse side of Si oxide film
16b Side surface of Si oxide film
17 Si film
17a obverse side of Si film
21 AlN film
21a obverse side of AlN film
22 GaN film
22a obverse side of GaN film
25 graphene film
25a obverse side of graphene film
31 retaining part
31a peripheral part of the retaining part
31b protrusion of the retaining part
100 pellicle film
CS reaction vessel
HP holding platform
MA liquid chemical
MK mask
PF pellicle frame
PL plane which is parallel to the surface of a SiC film
PN pattern
RG1 central part of the reverse side of the Si substrate
RG2 bottom of the recessed part of the Si substrate
RG3 peripheral part of the reverse side of the Si substrate
RG4 exposed central part of the reverse side of the Si substrate
SP space between peripheral parts and multiple protrusions in the retaining part

What is claimed is:

1. A method for manufacturing a compound semiconductor substrate, wherein the method comprises:
    a step of forming a SiC film on one principal surface side of a Si substrate,
    a step of forming a recessed part in which a bottom surface is Si in a central part of another principal surface of the Si substrate, and
    a step of exposing at least a part of a principal surface of the SiC film on the Si substrate side by wet etching of Si located at the bottom surface of the recessed part and Si located at the peripheral part of the recessed part, wherein
    in the step of exposing at least a part of a principal surface of the SiC film on the Si substrate side, at least the Si substrate and the SiC film are relatively moved with respect to the liquid chemical used for the wet etching, and
    in the step of exposing at least a part of a principal surface of the SiC film on the Si substrate side, the SiC film is exposed on the bottom surface of the recessed part, and the peripheral part of the recessed part is surrounded by the Si substrate.

2. The method for manufacturing a compound semiconductor substrate according to claim 1, wherein
    in the step of exposing at least a part of a principal surface of the SiC film on the Si substrate side, at least the Si substrate and the SiC film are moved in a direction in a plane parallel to the one principal surface of the SiC film.

3. The method for manufacturing a compound semiconductor substrate according to claim 2, wherein
    in the step of exposing at least a part of a principal surface of the SiC film on the Si substrate side, at least the Si substrate and the SiC film being rotated, a liquid chemical used for the wet etching is injected into the other principal surface of the Si substrate.

4. The method for manufacturing a compound semiconductor substrate according to claim 1, wherein
    the step of forming the SiC film is performed after the step of forming the recessed part in the central part of the other principal surface of the Si substrate.

5. The method for manufacturing a compound semiconductor substrate according to claim 1, wherein
    the step of forming the recessed part in the central part of the other principal surface of the Si substrate is performed after the step of forming the SiC film.

* * * * *